(12) United States Patent
Hayashishita

(10) Patent No.: US 12,068,188 B2
(45) Date of Patent: Aug. 20, 2024

(54) COMPONENT PRODUCING METHOD, HOLDING FILM, AND HOLDING TOOL FORMING DEVICE

(71) Applicant: MITSUI CHEMICALS TOHCELLO, INC., Tokyo (JP)

(72) Inventor: Eiji Hayashishita, Nagoya (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 0 days.

(21) Appl. No.: 16/967,495

(22) PCT Filed: Feb. 18, 2019

(86) PCT No.: PCT/JP2019/005913
§ 371 (c)(1),
(2) Date: Aug. 5, 2020

(87) PCT Pub. No.: WO2019/167702
PCT Pub. Date: Sep. 6, 2019

(65) Prior Publication Data
US 2021/0217644 A1    Jul. 15, 2021

(30) Foreign Application Priority Data
Feb. 28, 2018 (JP) .................................. 2018-035770

(51) Int. Cl.
*H01L 21/683* (2006.01)
*C09J 7/25* (2018.01)
(Continued)

(52) U.S. Cl.
CPC .......... *H01L 21/6836* (2013.01); *C09J 7/255* (2018.01); *C09J 7/385* (2018.01);
(Continued)

(58) Field of Classification Search
CPC ..... C09J 7/22; H01L 21/6836; H01L 21/6835
See application file for complete search history.

(56) References Cited

U.S. PATENT DOCUMENTS 3,766,638 A * 10/1973 Moore .............. H01L 21/67132
438/464
8,110,058 B2    2/2012 Kaneshima et al.
(Continued)

FOREIGN PATENT DOCUMENTS

JP    2007214357 A    8/2007
JP    2011061097 A    3/2011
(Continued)

OTHER PUBLICATIONS

WO_2017002610_A1_Machine_translation.pdf (Year: 2017).*
(Continued)

*Primary Examiner* — Brian Turner
(74) *Attorney, Agent, or Firm* — Panitch Schwarze Belisario & Nadel LLP

(57) ABSTRACT

A component manufacturing method includes a step of obtaining a holding tool. The holding tool includes: a frame body having an opening; and a holding film placed on the frame body. The step is a step of placing the holding film on the frame body while stretching the holding film in at least three different directions or in all directions to the frame body. The holding film includes a base layer and a holding layer. The holding tool forming device includes: a mechanism that pushes a plain film from a base layer side to bring about a stretched state; a mechanism that fixes the plain film to the frame body such that the stretched state is maintained; and a mechanism that isolates an unnecessary portion from the plain film to obtain the holding film.

8 Claims, 10 Drawing Sheets

(51) Int. Cl.
    *C09J 7/38*     (2018.01)
    *H01L 21/67*    (2006.01)
    *H01L 21/78*    (2006.01)
(52) U.S. Cl.
    CPC ........ *H01L 21/67132* (2013.01); *H01L 21/78* (2013.01); *C09J 2203/326* (2013.01); *C09J 2433/00* (2013.01); *C09J 2467/006* (2013.01); *C09J 2477/006* (2013.01); *H01L 2221/68336* (2013.01)

(56) References Cited

U.S. PATENT DOCUMENTS

| | | | |
|---|---|---|---|
| 8,281,838 | B2 | 10/2012 | Kaneshima et al. |
| 2003/0211813 | A1* | 11/2003 | Kassir ................. B24B 37/30 451/28 |
| 2006/0005911 | A1* | 1/2006 | Kubo ................. H01L 21/6836 156/84 |
| 2007/0181245 | A1 | 8/2007 | Kaneshima et al. |
| 2008/0105383 | A1* | 5/2008 | Kubo ............... H01L 21/67132 156/494 |
| 2011/0189835 | A1* | 8/2011 | Sugo ..................... B32B 7/12 438/464 |
| 2012/0012658 | A1* | 1/2012 | Komiyama .......... G06K 19/022 156/253 |
| 2012/0097338 | A1 | 4/2012 | Kaneshima et al. |
| 2014/0295646 | A1* | 10/2014 | Shinoda .............. H01L 21/6836 438/464 |
| 2015/0017374 | A1* | 1/2015 | Aoyama ............. H01L 21/6836 428/41.8 |
| 2015/0099346 | A1* | 4/2015 | Yamashita ........... H01L 21/302 438/462 |
| 2015/0348821 | A1* | 12/2015 | Iwanaga ................ H01L 24/27 257/798 |
| 2016/0007479 | A1* | 1/2016 | Hattori .............. H01L 21/67115 29/740 |
| 2016/0013079 | A1* | 1/2016 | Choi ................. H01L 21/67051 156/345.21 |
| 2016/0126218 | A1* | 5/2016 | Kurita .................... H01L 24/75 156/349 |
| 2018/0142130 | A1 | 5/2018 | Hayashishita |
| 2018/0211877 | A1* | 7/2018 | Priewasser ............ H01L 21/78 |
| 2019/0103298 | A1 | 4/2019 | Hayashishita |

FOREIGN PATENT DOCUMENTS

| | | | |
|---|---|---|---|
| JP | 2013229515 A | 11/2013 | |
| JP | 2014049627 A | 3/2014 | |
| JP | 2015082642 A | 4/2015 | |
| JP | 6196751 B1 | 9/2017 | |
| WO | 2017002610 A1 | 1/2017 | |
| WO | WO-2017002610 A1 * | 1/2017 | ............ C09J 133/08 |
| WO | 2017169747 A1 | 10/2017 | |

OTHER PUBLICATIONS

Notice of Reasons for Refusal issued on Nov. 12, 2021, by the Japanese Patent Office in corresponding Japanese Patent Application No. 2020-503411 and an English translation of the Notice. (10 pages).

International Search Report (with an English Translation) and Written Opinion issued on May 7, 2019, in corresponding International Patent Application No. PCT/JP2019/005913, 8 pages.

Notification of Reason for Refusal issued Nov. 17, 2021, by the Korean Intellectual Property Office in corresponding Korean Patent Application No. 10-2020-7020515, and an English translation of the Notification. (13 pages).

Notification Letter of Review Opinion issued on May 18, 2022, by the Taiwanese Patent Office in corresponding Taiwanese Patent Application No. 108106210 and an English translation of the Notification. (11 pages).

Notification Letter of Review Opinion issued on Aug. 4, 2022, by the Taiwanese Patent Office in corresponding Taiwanese Patent Application No. 108106210 and an English translation of the Notification. (12 pages).

* cited by examiner

COMPONENT PRODUCING METHOD, HOLDING FILM, AND HOLDING TOOL FORMING DEVICE

TECHNICAL FIELD

The present invention relates to a component manufacturing method, a holding film, and a holding tool forming device. More specifically, the present invention relates to: a method for manufacturing any component selected from a semiconductor component and an electronic component; a holding film for holding a component for use in this component manufacturing method; and a holding tool forming device for forming a holding tool for use in this component manufacturing method.

BACKGROUND ART

In recent years, there has been known a method of manufacturing a semiconductor component, the method including: dividing a wafer on which circuits are formed; evaluating (inspecting) the divided semiconductor components; picking up only semiconductor components that have passed the evaluation; and sending the picked up semiconductor components to subsequent steps. This manufacturing method is disclosed in, for example, Patent Literature 1 listed below (see claim 1 and the like). This configuration enables improvement in yield rate of the final products.

CITATIONS LIST

Patent Literatures

Patent Literature 1: WO 2017/002610 A1
Patent Literature 2: JP 2013-229515 A
Patent Literature 3: JP 2015-082642 A

SUMMARY OF INVENTION

Technical Problems

The inventor of the present invention has proposed in Patent Literature 1 listed above that a base layer of a film for manufacturing a component (a holding film) is made of a resin material having a specific elastic characteristic within a predetermined temperature range. According to this configuration, a holding film can be shared among multiple steps including an evaluation step, a dividing step, and a pickup step. As a result, it becomes unnecessary to replace a holding film for holding a workpiece with a new one in each step, leading to excellent productivity.

Moreover, it has newly been turned out that the use of this holding film enables chucking to a chuck table in a normal temperature range without problem, but is sometimes less likely to achieve chucking to a heated chuck table.

The present invention has been made in view of the problem described above. An object of the present invention is to provide: a component manufacturing method capable of reliably chucking a holding film to a heated chuck table; and a holding film and a holding tool forming device each usable in this component manufacturing method.

It should be noted that Patent Literatures 2 and 3 listed above disclose a conventional method of placing a holding film to be used in manufacturing a semiconductor component. According to the methods disclosed in these literatures, an assumption is made on only use under a normal temperature environment, and no consideration is taken as to application to a holding film including such an elastic base layer as that described above. In addition, there are no knowledge about and attention to, for example, the presence of a component manufacturing method that uses a heated chuck table and a specific problem that may arise in using the foregoing holding film on the heated chuck table. Moreover, there is no consideration on these matters.

Solutions to Problems

That is, the present invention is as follows.

[1] The gist of a component manufacturing method according to claim 1 is a component manufacturing method for manufacturing any component selected from a semiconductor component and an electronic component,
the component manufacturing method comprising:
a holding tool forming step of forming a holding tool for holding a precursor to be processed into the component,
wherein
the holding tool includes: a frame body having an opening; and a holding film placed on the frame body so as to cover the opening,
the holding tool forming step is a step of placing the holding film on the frame body while stretching the holding film in at least three different directions or in all directions to the frame body,
the holding film includes: a base layer; and a holding layer disposed on a first surface side of the base layer,
a ratio $R_{E1}$ (=E'(100)/E'(25)) of an elastic modulus E'(100) of the base layer at 100° C. to an elastic modulus E'(25) of the base layer at 25° C. is in a range of $0.2 \leq R_{E1} \leq 1$, and
the elastic modulus E'(25) is in a range from 35 MPa or more to 1500 MPa or less.

[2] The gist of a component manufacturing method according to claim 2 is the component manufacturing method according to claim 1, wherein
the holding tool forming step includes:
a stretching step of pushing a plain film for the holding film from the base layer side to bring about a stretched state;
a fixing step of fixing the plain film to the frame body such that the stretched state is maintained; and
an isolating step of isolating an unnecessary portion from the plain film to obtain the holding film.

[3] The gist of a component manufacturing method according to claim 3 is the component manufacturing method according to claim 1 or 2, wherein
the holding tool forming step is a step of placing the holding film on the frame body such that stretch ratios measured in three different conformal radial directions with a center of the opening defined as a base point take an average value of 0.3% or more.

[4] The gist of a component manufacturing method according to claim 4 is the component manufacturing method according to claim 2 or 3, wherein
the stretching step is a step of pushing the plain film from the base layer side with a push jig to stretch the plain film, and
the push jig to be brought into contact with the plain film has a substantially circular contact outer edge.

[5] The gist of a component manufacturing method according to claim 5 is the component manufacturing method according to any of claims 2 to 4, further comprising:

a holding step of holding the precursor in a stretched region of the plain film in the holding tool forming step or on the holding film of the obtained holding tool.

[6] The gist of a component manufacturing method according to claim 6 is the component manufacturing method according to claim 5, further comprising:
a dividing step of, after the holding step, dividing the precursor while holding the precursor on the holding film to obtain divided components.

[7] The gist of a component manufacturing method according to claim 7 is the component manufacturing method according to claim 5 or 6, further comprising:
a chucking step of, after the holding step, chucking the holding film on which the precursor is held or the divided components are held, to a surface of the chuck table that is heated, from the base layer side.

[8] The gist of a component manufacturing method according to claim 8 is the component manufacturing method according to claim 7, further comprising:
a pickup step of, in a case where the divided components are held on the holding film after the chucking step, pushing some of the divided components from the base layer side toward the holding layer side to further stretch the holding film, and picking up the divided components thus pushed while separating the divided components from the remaining divided components.

[9] The gist of a holding film according to claim 9 is a holding film for use in the component manufacturing method according to any of claims 1 to 8,
the holding film comprising: the base layer; and the holding layer disposed on the first surface side of the base layer, wherein
a ratio $R_{E1}$ ($=E'(100)/E'(25)$) of an elastic modulus $E'(100)$ of the base layer at 100° C. to an elastic modulus $E'(25)$ of the base layer at 25° C. is in a range of $0.2 \leq R_{E1} \leq 1$, and the elastic modulus $E'(25)$ is in a range from 35 MPa or more to 1500 MPa or less.

[10] The gist of a holding film according to claim 10 is the holding film according to claim 9, wherein
the base layer has a linear thermal expansion coefficient of 100 ppm/K or more.

[11] The gist of a holding film according to claim 11 is the holding film according to claim 9 or 10, wherein
the base layer contains at least one of a thermoplastic polyester-based elastomer, a thermoplastic polyamide-based elastomer, or polybutylene terephthalate.

[12] The gist of a holding tool forming device according to claim 12 is a holding tool forming device for forming a holding tool that holds a precursor to be processed into any component selected from a semiconductor component and an electronic component, in processing the precursor into the component,
the holding tool including: a frame body having an opening; and a holding film placed on the frame body so as to cover the opening while being stretched in at least three different directions or in all directions to the frame body,
the holding film including: a base layer; and a holding layer disposed on a first surface side of the base layer,
a ratio $R_{E1}$ ($=E'(100)/E'(25)$) of an elastic modulus $E'(100)$ of the base layer at 100° C. to an elastic modulus $E'(25)$ of the base layer at 25° C. being in a range of $0.2 \leq R_{E1} \leq 1$,
the elastic modulus $E'(25)$ being in a range from 35 MPa or more to 1500 MPa or less, the holding tool forming device comprising:
a stretching mechanism that pushes a plain film for the holding film from the base layer side to bring about a stretched state;
a fixing mechanism that fixes the plain film to the frame body such that the stretched state is maintained; and
an isolating mechanism that isolates an unnecessary portion from the plain film to obtain the holding film.

[13] The gist of a holding tool forming device according to claim 13 is the holding tool forming device according to claim 12, wherein
the stretching mechanism includes a push jig that pushes the plain film from the base layer side to stretch the plain film, and
the push jig to be brought into contact with the plain film has a substantially circular contact outer edge.

[14] The gist of a holding tool forming device according to claim 14 is the holding tool forming device according to claim 13, wherein
the contact outer edge of the push jig is subjected to low friction processing capable of reducing friction between the push jig and the plain film.

Advantageous Effects of Invention

The present component manufacturing method is capable of reliably chucking a holding film to a heated chuck table. As a result, it becomes unnecessary to introduce a cooling cycle for cooling a heated chuck table in order to chuck a holding film to the chuck table. It is thus possible to efficiently manufacture a component. In addition, as described above, it is possible to acquire the conventional merit of eliminating the necessity to replace a holding film in each step as it is. It is therefore possible to efficiently manufacture a component while using a common holding film, irrespective of a kind of a step in the component manufacturing method.

The present holding film can be reliably chucked to a heated chuck table. As a result, it becomes unnecessary to introduce a cooling cycle for cooling a heated chuck table in order to chuck a holding film to the chuck table. It is thus possible to efficiently manufacture a component. In addition, as described above, it is possible to acquire the conventional merit of eliminating the necessity to replace a holding film in each step as it is. It is therefore possible to efficiently manufacture a component while using a common holding film, irrespective of a kind of a step in the component manufacturing method.

The present holding tool forming device is capable of forming a holding tool allowing a holding film to be reliably chucked to a heated chuck table. As a result, it becomes unnecessary to introduce a cooling cycle for cooling a heated chuck table in order to chuck a holding film to the chuck table. It is thus possible to efficiently manufacture a component. In addition, as described above, it is possible to acquire the conventional merit of eliminating the necessity to replace a holding film in each step as it is. It is therefore possible to efficiently manufacture a component while using a common holding film, irrespective of a kind of a step in the component manufacturing method.

DESCRIPTION OF EMBODIMENTS

The present invention will be described below with reference to the drawings. Matters described herein are merely illustrative and exemplify embodiments of the present invention. The matters are therefore described for the sake of most effectively understanding the principles and conceptual features of the present invention without difficulties. In this respect, the matters are merely described for fundamental understanding of the present invention, and therefore do not intend to show structural details of the present invention more than a certain degree. The matters make those skilled in the art clear how to actually achieve some embodiments of the present invention on the basis of the description in conjunction with the drawings.

[1] Component Manufacturing Method

The present component manufacturing method is a method for manufacturing any component (50) selected from a semiconductor component and an electronic component.

Figure 1:
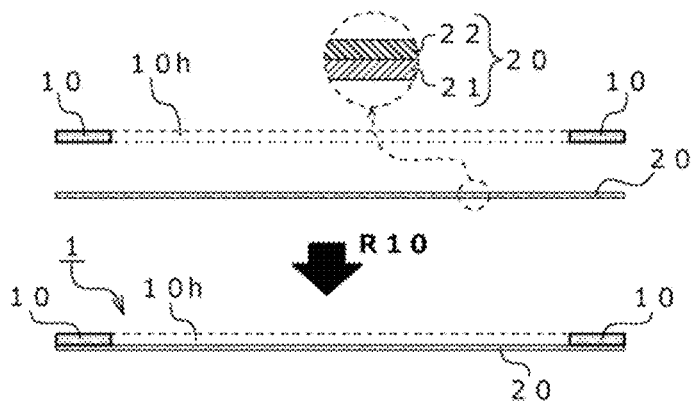
FIG. 1 is an explanatory view that illustrates a holding tool forming step in the present component manufacturing method.

The present component manufacturing method includes a holding tool forming step (R10) of forming a holding tool (1) for holding a precursor to be processed into a component (see FIG. 1).

The holding tool forming step (R10) is a step of forming the holding tool (1) by placing a holding film (20) on a frame body (10) while stretching the holding film (20) in at least three different directions or in all directions to the frame body. The holding tool (1) thus formed includes: the frame body (10) having an opening (10h); and the holding film (20) placed on the frame body (10) so as to cover the opening (10h).

The holding film (20) includes a base layer (21); and a holding layer (22) disposed on a first surface side of the base layer (21). A ratio $R_{E1}$ (=E'(100)/E'(25)) of an elastic modulus E'(100) of the base layer (21) at 100° C. to an elastic modulus E'(25) of the base layer (21) at 25° C. is in a range of $0.2 \leq R_{E1} \leq 1$. The elastic modulus E'(25) is in a range from 35 MPa or more to 1500 MPa or less.

As described above, the inventor of the present invention has suggested in Patent Literature 1 listed above that a holding tool 1 sharable among multiple steps including an evaluation step, a dividing step, and a pickup step can be provided by the use of a holding film 20 including a base layer 21 made of a resin material satisfying relations of $0.2 \leq R_{E1} \leq 1$ and 35 MPa $\leq$ E'(25) $\leq$ 3500 MPa as a film for manufacturing a component. The inventor of the present invention has also suggested that as a result, it becomes unnecessary to replace a carrier for a workpiece in each step, leading to excellent productivity.

However, it has newly been turned out that, for example, wrinkles (hereinafter, also referred to as "heat wrinkles") are sometimes formed on the holding film 20 in the evaluation step involving evaluation at high temperature. The wrinkles on the holding film 20 cause chucking leak in chucking the holding film 20 to a chuck table, which hinder normal chucking to the chuck table. The wrinkles also cause surface irregularities on the holding film 20. It has therefore been turned out that a malfunction may occur, for example, in an evaluation step, a probe does not normally come into contact with some components for evaluation.

It has also been turned out that this phenomenon remarkably occurs particularly in the evaluation step using the chuck table that is always heated without being successively cooled, for the sake of efficient evaluation. It has also been confirmed that in chucking the holding film 20 to the heated chuck table, this phenomenon occurs even before the holding film 20 comes into contact with a surface of the chuck table, that is, even in a state in which the holding film 20 is separated from the surface of the chuck table.

From these reasons, the inventor of the present invention has eventually thought that heat convection occurring at the surface of the chuck table starts to heat the holding film 20 even in the state in which the holding film 20 is separated from the chuck table, and this heating thermally expands the holding film 20 to cause the wrinkles.

The inventor of the present invention has thought that this problem can be solved in such a manner that the holding film 20 is preliminarily stretched by means of its elastic characteristic since the base layer 21 is made of the foregoing resin material. Specifically, the inventor of the present invention has thought that thermal expansion and stretch caused by heat convection is absorbable in such a manner that the holding film 20 is placed on the frame body 10 while being stretched. It has been found from this that thermal expansion and stretch caused by heat convection is absorbable even in, for example, a device complying with a specification by which the device must be in a standby state with the holding film 20 exposed to heat convection on the chuck table.

In addition, the holding tool in which the holding film is placed on the frame body while being tensed in two directions (opposite directions), as disclosed in Patent Literature 2 listed above, is incapable of preventing the foregoing heat wrinkles. It has been considered that according to this configuration, since the holding film is placed on the frame body while being tensed in only the two directions, no tension is applied in a direction substantially perpendicular to the tension directions to cause thermal expansion in substantially the perpendicular direction, which results in heat wrinkles. Hence, the inventor of the present invention has found that all heat wrinkles can be prevented comprehensively in such a manner that the holding film 20 is placed on the frame body 10 while being stretched in at least three different directions (the holding film 20 may be stretched in all directions) to thereby complete the present invention.

In the holding tool 1 having the foregoing configuration, the holding film 20 can be reliably chucked to the chuck table under the heated environment even when the base layer 21 is made of the resin material satisfying the relations of $0.2 \leq R_{E1} \leq 1$ and 35 MPa$\leq$E'(25)$\leq$1500 MPa. In other words, even when the heat convection from the heated chuck table thermally expands the holding film 20 before being chucked to the chuck table, this thermal expansion is absorbable when the stretch of the base layer 21 is reduced. On the other hand, the stretch of the base layer 21 is reduced by this thermal expansion; however, this thermal expansion causes no heat wrinkles. Since no heat wrinkles are formed on the holding film 20, no airtight leak occurs in chucking the holding film 20 to the chuck table, so that the holding tool 1 can be normally chucked and fixed to the chuck table. This enables, for example, normal evaluation in the evaluation step. That is, unintentional deviation and contact of a held component 50 which is a target to be evaluated from and with an evaluation device (e.g., a probe) or the like is prevented to enable normal evaluation.

In the holding tool 1 according to the present invention, the use of the base layer 21 made of the resin material having the characteristics of $0.2 \leq R_{E1} \leq 1$ and 35 MPa$\leq$E'(25)$\leq$1500 MPa maintains a room for further stretch in order to separate held components 50 (specifically, secondary precursors 52) which are divided from each other for the subsequent pickup step, irrespective of whether the heating in chucking the holding film 20 to the chuck table reduces the stretch of the holding film 20. In other words, even in the case where the holding film 20 is not heated when being chucked to the chuck table and is therefore still preliminarily stretched, the holding film 20 can further be stretched from this state such that the held components 50 are separated from each other for pickup.

<1> Component

As described above, the holding tool 1 for use in the present method is a jig for holding, for example, a precursor to be processed into a component, in manufacturing the component.

The term "component" (a finished-component) used herein refers to an object on which all the processing for a precursor has been completed. On the other hand, the term "precursor" refers to an object on which the processing for a precursor is not completed yet in the course of processing the precursor into a component. In addition, the precursor can be classified into, for example, a precursor before being divided as a primary precursor and a divided precursor as a secondary precursor (divided component), depending on the processing stage of the precursor. The holding tool 1 is capable of holding objects at all the processing stages, including the component, the precursor, the primary precursor, and the secondary precursor. In other words, targets to be held by the holding tool 1 include objects at all the processing stages, such as the component, the precursor, the primary precursor, and the secondary precursor.

In the present specification, it is sometimes difficult to separately describe the targets to be held, in accordance with the respective processing stages; therefore, a held component 50 to be described below indicates an object held by the holding tool 1, irrespective of the processing stage.

Specific examples of the held component 50 may include, but not limited to, (1) a semiconductor wafer, (2) a semiconductor wafer on which circuits are formed, (3) a precursor of a semiconductor component obtained by dividing a semiconductor wafer on which circuits are formed, (4) a semiconductor component, (5) various frames (not divided) before a semiconductor component is mounted, (6) an array-shaped electronic component obtained by mounting a semiconductor component on various frames, (7) an array-shaped electronic component obtained by sealing a semiconductor component with a sealant, and (8) an electronic component obtained by dividing an array-shaped electronic component.

In the case where a precursor before being divided is distinguished as a primary precursor 51, and a divided precursor is distinguished as a secondary precursor 52 as descried above, examples of the primary precursor 51 include (1) a semiconductor wafer, (2) a semiconductor wafer on which circuits are formed, (5) various frames (not divided) before a semiconductor component is mounted, (6) an array-shaped electronic component obtained by mounting a semiconductor component on various frames, and (7) an array-shaped electronic component obtained by sealing a semiconductor component with a sealant. On the other hand, examples of the secondary precursor 52 include (3) a precursor of a semiconductor component obtained by dividing a semiconductor wafer on which circuits are formed, (4) a semiconductor component, and (8) an electronic component obtained by dividing an array-shaped electronic component.

Furthermore, the foregoing array-shaped electronic component may take the following forms (1) to (3).

(1): An array-shaped electronic component obtained by: arraying, on a lead frame, semiconductor components (chips, dies) obtained from a semiconductor wafer on which circuits are formed; wire-bonding the semiconductor components; and then sealing the semiconductor components with a sealant.

(2): An array-shaped electronic component obtained by: separately arraying semiconductor components (chips, dies) obtained from a semiconductor wafer on which circuits are formed; sealing the semiconductor components with a sealant; and then collectively forming external circuits for conduction with the outside, such as a rewiring layer and a bump electrode. That is, this array-shaped electronic component is an array-shaped electronic component obtained in a fan-out system (an eWLB system).

(3): An array-shaped electronic component obtained by using a semiconductor wafer in a wafer state as it is; and collectively forming external circuits for conduction with the outside, such as a rewiring layer and a bump electrode, and a sealed layer sealed with a sealant. The semiconductor wafer in the form (3) takes, for example, a form in a state before being divided, where semiconductor components (chips, dies) are formed in an array shape, and a form where a semiconductor wafer is used as a substrate (a form where a chip having circuits is joined onto a non-circuit silicon substrate to be used). That is, an example of the array-shaped electronic component in the form (3) includes an array-shaped electronic component obtained in a wafer-level chip size package (WLCSP) method.

In addition, examples of the foregoing circuits may include, but not limited to, a wire, a capacitor, a diode, and a transistor. One of them may be used alone or at least two of them may be used in combination.

<2> Holding Tool Forming Step

The holding tool forming step R10 is a step of forming the holding tool 1.

The step R10 includes forming the holding tool 1 by placing the holding film 20 on the frame body 10 while stretching the holding film 20 in at least three different directions or in all directions to the frame body.

It should be noted in the present invention that no held component 50 is held on a holding film 20 (or a plain film 201) that is before being stretched or is in a stretched state. In other words, a held component 50 can be held after a holding film 20 (or a plain film 201) is at least stretched. The holding step R11 of holding a held component 50 will be described later.

<2-1> Holding Tool

The holding tool 1 includes the frame body 10 and the holding film 20.

<2-2> Frame Body

The frame body 10 is a component for fixing the holding film 20 while maintaining the holding film 20 in a stretched state. Therefore, the frame body 10 has rigidity such that the frame body 10 is not deformed due a tension of the stretched holding film 20. The frame body 10 has an opening 10h. In manufacturing a component, a held component 50 can be held in a region of the holding film 20, the region being located in the opening 10h of the frame body 10. The size, shape, and the like of the opening 10h are not limited and can be appropriately set in accordance with manufacture of a component. The frame body 10 is not limited as long as it has the opening 10h.

Figure 5:
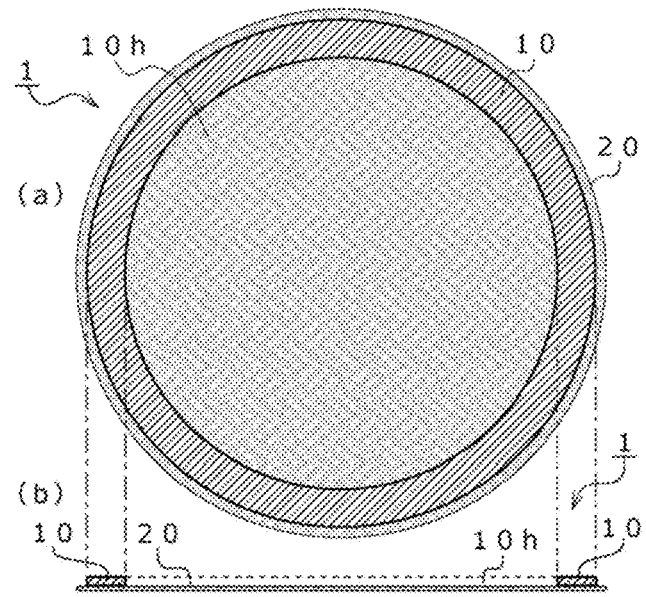
FIG. 5 is an explanatory view of (a) a planar form of an exemplary holding tool obtained by the present component manufacturing method and (b) the corresponding sectional form.

The frame body 10 may be, for example, a frame body 10 composed of a ring-shaped single component. An example of the frame body 10 composed of a single component includes (1) a frame body 10 formed of a ring-shaped flat plate (see FIG. 5).

Figure 6:
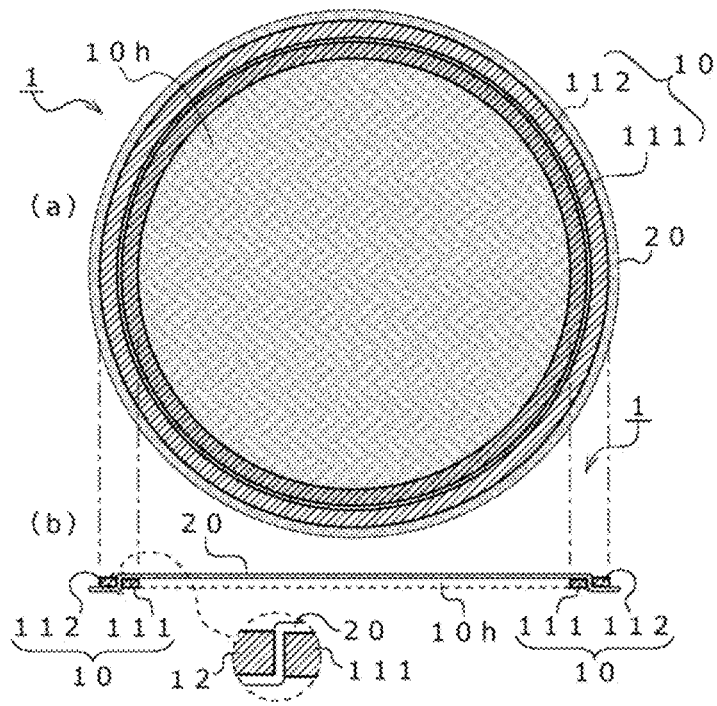
FIG. 6 is an explanatory view of (a) a planar shape of another exemplary holding tool obtained by the present component manufacturing method and (b) the corresponding sectional form.
Figure 7:
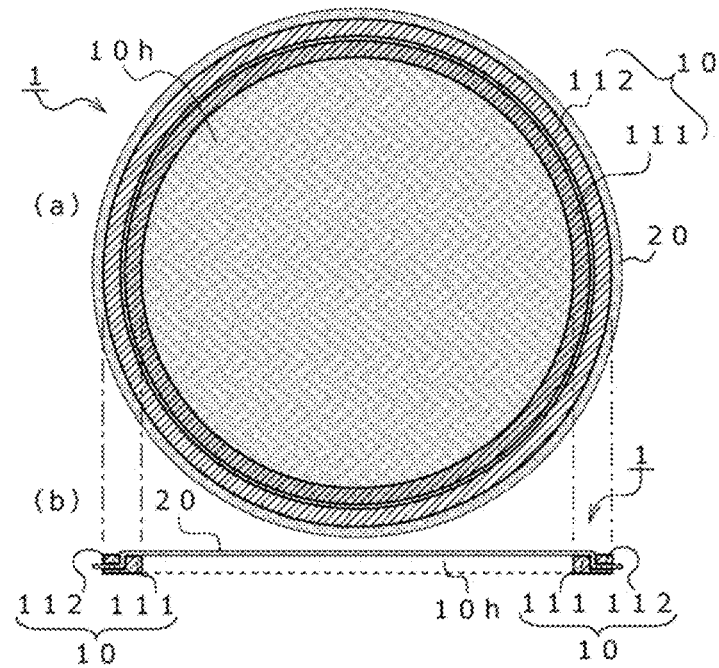
FIG. 7 is an explanatory view of (a) a planar form of still another exemplary holding tool obtained by the present component manufacturing method and (b) the corresponding sectional form.
Figure 8:
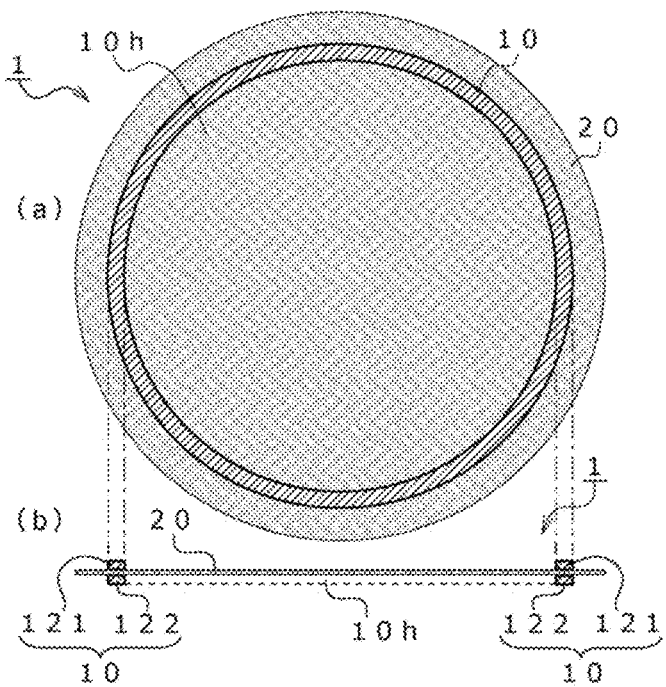
FIG. 8 is an explanatory view of (a) a planar form of yet another exemplary holding tool obtained by the present component manufacturing method and (b) the corresponding sectional form.

Alternatively, the frame body 10 may also be a frame body 10 composed of multiple components formed by engagement into one frame body 10 (see FIGS. 6 to 8). An example of the frame body 10 composed of multiple components includes (2) a frame body 10 including a ring-shaped inner frame 111 and a ring-shaped outer frame 112 engageable with the inner frame 111 (see FIGS. 6 and 7). An example of the frame body 10 composed of multiple components also includes (3) a frame body 10 including a ring-shaped upper frame 121 and a ring-shaped lower frame 122 engageable with the upper frame 121 (a form in which the upper frame 121 is stacked on the lower frame 122) (see FIG. 8). The frame body 10 composed of multiple components may take, but not limited to, an engagement form by fitting (e.g., a projections and depressions form) or another engagement form such as engagement by magnetization.

Figure 3:
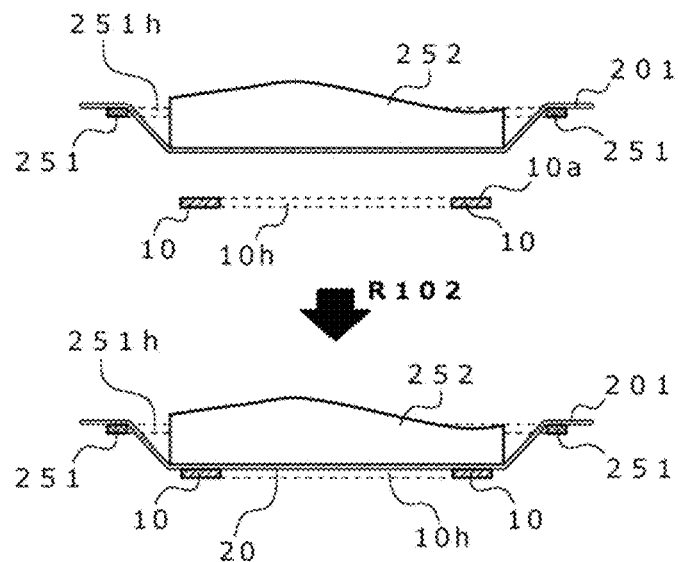
FIG. 3 is an explanatory view that illustrates a fixing step in the present component manufacturing method.

As described above, in the case where the frame body 10 is (1) a frame body 10 formed of a ring-shaped flat plate (see FIG. 5), the holding layer 22 of the holding film 20 is formed as a layer adherable to a first surface 10a of the frame body 10, so that the holding film 20 can be placed on the frame body 10 in such a manner that the holding layer 22 adheres to the first surface 10a of the frame body 10 (see FIG. 3). That is, the holding film 20 can be fixed to the frame body 10 while being stretched.

On the other hand, in the case where the frame body 10 is (2) a frame body 10 including an inner frame 111 and an outer frame 112 (see FIGS. 6 and 7), the holding film 20 can be placed on the frame body 10 in such a manner that the holding film 20 is sandwiched between the frames (between the inner frame 111 and the outer frame 112). Moreover, in the case where the frame body 10 is (3) a frame body 10 including an upper frame 121 and a lower frame 122 (see FIG. 8), the holding film 20 can be placed on the frame body 10 in such a manner that the holding film 20 is sandwiched between the frames (between the upper frame 121 and the lower frame 122). That is, the holding film 20 can be fixed to the frame body 10 while being stretched.

It should be noted that the term "ring-shaped" means that a frame has an opening 10h, but does not intend to limit the specific opening area and shape of the opening 10h, the shape of the frame, and others. That is, the contour of the frame may be a circular shape, a polygonal shape, or any other shape. In addition, the inner shape of the frame may correspond to the outer shape of the frame (for example, both the inner and outer shapes are a circular shape). Alternatively, the inner shape of the frame does not necessarily correspond to the outer shape of the frame (for example, the inner shape is a polygonal shape, whereas the outer shape is a circular shape).

For example, an organic material (e.g., a resin, an elastomer) and an inorganic material (e.g., a metal, ceramic) can be appropriately used as a material for the frame body 10 as necessary; however, the material for the frame body 10 is not limited thereto. Examples of the organic material may include, but not limited to, a polycarbonate resin, an ABS resin, a polyester resin (e.g., an aromatic polyester resin, a crystalline polyester resin), a polyamide resin (e.g., an aromatic polyamide resin), a polyimide resin, and a polyamide imide resin. One of them may be used alone or at least two of them may be used in combination. A reinforcing member can be further blended into the organic material. Examples of the reinforcing member may include, but not limited to, an inorganic material filler, an inorganic material reinforcing fiber (e.g., a glass fiber, a carbon fiber), an organic material filler, and an organic material reinforcing fiber (e.g., an aromatic polyamide resin fiber). One of the reinforcing members may be used alone or at least two of the reinforcing members may be used in combination.

<2-3> Holding Film

The holding film 20 includes the base layer 21 and the holding layer 22.

<2-4> Base Layer

The base layer 21 has the characteristics of $0.2 \leq R_{E1} \leq 1$ and 35 MPa$\leq$E'(25)$\leq$1500 MPa as described above. More specifically, the base layer 21 may be made of a thermoplastic elastomer having the foregoing characteristics.

Since the base layer 21 has the foregoing characteristics, this holding film 20 can be placed on the frame body 10 while being stretched. Therefore, the holding film 20 can be chucked and fixed to the chuck table without heat wrinkles even when being heated. In addition, the holding film 20 has flexibility so as to be further stretched from the stretched state when being picked up.

In a case where the ratio $R_{E1}$ satisfies a relation of $R_{E1}<0.2$, although the holding tool 1 can be chucked to the heated chuck table, the holding film 20 is likely to adhere to the chuck table in separating the holding tool 1 from the chuck table, so that the holding tool 1 is less likely to be separated from the chuck table in the heated state. This case is not preferable from the viewpoint of reduction in time cycle in manufacturing a component since some measures, such as cooling of the chuck table, are required for separation of the holding tool 1 from the chuck table.

The foregoing ratio $R_{E1}$ is preferably in the range of $0.2 \leq R_{E1} \leq 1$, more preferably in a range of $0.23 \leq R_{E1} \leq 0.90$, more preferably in a range of $0.24 \leq R_{E1} \leq 0.80$, more preferably in a range of $0.30 \leq R_{E1} \leq 0.78$, more preferably in a range of $0.32 \leq R_{E1} \leq 0.75$, more preferably in a range of $0.35 \leq R_{E1} \leq 0.70$, more preferably in a range of $0.38 \leq R_{E1} \leq 0.65$. In each of the preferable ranges, it is possible to effectively prevent formation of heat wrinkles even when the chuck table is heated, and it is also possible to remove the holding tool 1 from the chuck table with ease after the stop of chucking.

In the range of $0.2 \leq R_{E1} \leq 1$, the elastic modulus E'(25) is preferably in a range of 38 MPa $\leq$ E'(25) $\leq$ 1000 MPa, more preferably in a range of 40 MPa $\leq$ E'(25) $\leq$ 700 MPa, more preferably in a range of 42 MPa $\leq$ E'(25) $\leq$ 500 MPa, more preferably in a range of 44 MPa $\leq$ E'(25) $\leq$ 350 MPa, more preferably in a range of 46 MPa $\leq$ E'(25) $\leq$ 250 MPa, more preferably in a range of 48 MPa $\leq$ E'(25) $\leq$ 200 MPa, more preferably in a range of 50 MPa $\leq$ E'(25) $\leq$ 180 MPa, more preferably in a range of 51 MPa $\leq$ E'(25) $\leq$ 150 MPa. The value of the elastic modulus E'(25) in the MD direction of the base layer may be different from that in the TD direction of the base layer. Preferably, both the value in the MD direction of the base layer and the value in the TD direction of the base layer fall within the foregoing ranges.

In addition, the elastic modulus E'(100) is preferably in a range of 10 MPa $\leq$ E'(100) $\leq$ 500 MPa, more preferably in a range of 15 MPa $\leq$ E'(100) $\leq$ 300 MPa, more preferably in a range of 17 MPa $\leq$ E'(100) $\leq$ 250 MPa, more preferably in a range of 20 MPa $\leq$ E'(100) $\leq$ 150 MPa, more preferably in a range of 25 MPa $\leq$ E'(100) $\leq$ 50 MPa, more preferably in a range of 26 MPa $\leq$ E'(100) $\leq$ 45 MPa, more preferably in a range of 27 MPa $\leq$ E'(100) $\leq$ 42 MPa. The value of the elastic modulus E'(100) in the MD direction of the base layer may be different from that in the TD direction of the base layer. Preferably, both the value in the MD direction of the base layer and the value in the TD direction of the base layer fall within the foregoing ranges.

It should be noted that "E'(100)" represents a tensile elastic modulus of the base layer 21 at 100° C., and "E'(25)" represents a tensile elastic modulus of the base layer 21 at 25° C. Each of the elastic moduli E' is measured with a dynamic viscoelasticity measurement apparatus (DMA: Dynamic Mechanical Analysis). Specifically, an elastic modulus is measured in a temperature range from −50° ° C. to 200° C. on measurement conditions that a sample size is 10 mm in width and 20 mm in length between chucks, a frequency is 1 Hz, and a heating rate is 5° C./min, and data on each temperature is read from data thus obtained. That is, a value at 25° C. is taken as the tensile elastic modulus E'(25), and a value at 100° C. is taken as the tensile elastic modulus E'(100).

In addition, the linear thermal expansion coefficient of the base layer 21 may be set at, but not limited to, 100 ppm/K or more. As described above, an example of a material for the base layer 21 includes a thermoplastic elastomer. Specifically, a thermoplastic elastomer is a material having a relatively larger linear thermal expansion coefficient. It is considered that such a larger linear thermal expansion coefficient is a driving factor that thermally expands the holding film 20 at high temperature to cause heat wrinkles. As described above, the holding film 20 including the base layer 21 of which the linear thermal expansion coefficient is 100 ppm/K or more tends to suffer from a chucking failure to the chuck table particularly under a heated environment due to, for example, wrinkles formed thereon. In contrast to this, even in the case of using the base layer 21 of which the linear thermal expansion coefficient is 100 ppm/K or more, it is possible to prevent a chucking failure to the chuck table under a heated environment, by setting the ratio $R_{E1}$ in the range of $0.2 \leq R_{E1} \leq 1$ and the elastic modulus E'(25) in the range from 35 MPa or more to 1500 MPa or less.

The linear thermal expansion coefficient is preferably in a range from 100 ppm/K or more to 300 ppm/K or less, more preferably in a range from 130 ppm/K or more to 280 ppm/K or less, more preferably in a range from 150 ppm/K or more to 250 ppm/K or less, more preferably in a range from 165 ppm/K or more to 240 ppm/K or less. The linear thermal expansion coefficient corresponds to an average thermal expansion ratio measured in accordance with JIS K7197 in a measured temperature range from 23° ° C. to 150° C.

For example, the thickness of the base layer 21 may be in a range from 50 μm or more to 500 μm or less, preferably in a range from 55 μm or more to 250 μm or less, more preferably in a range from 60 μm or more to 200 μm or less, still more preferably in a range from 65 μm or more to 185 μm or less, particularly preferably in a range from 70 μm or more to 170 μm or less; however, the thickness of the base layer 21 is not limited thereto. In should be noted that it does not matter whether the base layer is stretched or not.

The base layer 21 is only required to have the foregoing various characteristics and to support the holding layer 22, and a material therefor is not particularly limited. A material for the base layer 21 is preferably a resin. Among various resins, a resin having satisfactory flexibility (mechanical elasticity) is preferably used, and a resin having an elastomeric property is particularly preferably used.

Examples of the resin having an elastomeric property may include, but not limited to, a thermoplastic elastomer and silicone. One of them may be used alone or at least two of them may be used in combination. Among them, since a resin having a thermoplastic property is preferable, a thermoplastic elastomer is preferably used. The thermoplastic elastomer may be composed of a block copolymer having a hard segment and a soft segment or may be composed of a polymer alloy of a hard polymer and a soft polymer. Alternatively, the thermoplastic elastomer may have characteristics of both the block copolymer and the polymer alloy.

In a case where the material for the base layer 21 contains a thermoplastic elastomer, a ratio of the thermoplastic elastomer to the entire resin for the base layer 21 may be, for example, in a range from 30% by mass or more to 100% by mass or less. In other words, the resin for the base layer 21 may be composed of only the thermoplastic elastomer. The ratio of the thermoplastic elastomer is more preferably in a range from 50% by mass or more to 100% by mass or less, more preferably in a range from 70% by mass or more to 100% by mass or less.

Specific examples of the thermoplastic elastomer may include, but not limited to, a polyester-based thermoplastic elastomer, a polyamide-based thermoplastic elastomer, a styrene-based thermoplastic elastomer, an olefin-based thermoplastic elastomer, a vinyl chloride-based thermoplastic elastomer, and a polyimide-based thermoplastic elastomer (e.g., a polyimide ester-based thermoplastic elastomer, a polyimide urethane-based thermoplastic elastomer). One of them may be used alone or at least two of them may be used in combination.

Among them, a polyester-based thermoplastic elastomer, a polyamide-based thermoplastic elastomer, and a polyimide-based thermoplastic elastomer are preferably used. Furthermore, a polyester-based thermoplastic elastomer and/or a polyamide-based thermoplastic elastomer are/is particularly preferably used.

The polyester-based thermoplastic elastomer may have any configuration as long as it contains a polyester component as a hard segment. Examples of the soft segment may include, but not limited to, polyester, polyether, and polyether-ester. One of them may be used alone or at least two of them may be used in combination. That is, for example, a polyester component constituting a hard segment may contain a structural unit derived from a monomer such as dimethyl terephthalate. On the other hand, a component constituting a soft segment may contain a structural unit derived from a monomer such as 1,4-butanediol or poly (oxytetramethylene)glycol.

More specifically, for example, a PBT-PE-PBT-type polyester-based thermoplastic elastomer is exemplified.

Examples of such a polyester-based thermoplastic elastomer may include, but not limited to, "PRIMALLOY (trade name)" manufactured by Mitsubishi Chemical Corporation, "Hytrel (trade name)" manufactured by DU PONT-TORAY CO., LTD., "PELPRENE (trade name)" manufactured by TOYOBO CO., LTD., "HYPER ALLOY ACTYMER (trade name)" manufactured by RIKEN TECHNOS CORPORATION., and others. One of them may be used alone or at least two of them may be used in combination.

A polyamide-based thermoplastic elastomer may have any constitution as long as it contains a polyamide component as a hard segment. Examples of the soft segment may include, but not limited to, polyester, polyether, and polyether-ester. One of them may be used alone or at least two of them may be used in combination. That is, examples of a polyamide component constituting a hard segment may include, but not limited to, polyamide 6, polyamide 11, and polyamide 12. One of them may be used alone or at least two of them may be used in combination. These polyamide components may contain, for example, various lactams as a monomer. On the other hand, a component constituting a soft segment may contain a structural unit derived from a monomer such as dicarboxylic acid or polyether polyol. As polyether polyol, polyether diol is preferably used, and examples thereof may include, but not limited to, poly (tetramethylene)glycol and poly(oxypropylene)glycol. One of them may be used alone or at least two of them may be used in combination.

Specific examples thereof may include, but not limited to, a polyether amide-type polyamide-based thermoplastic elastomer, a polyester amide-type polyamide-based thermoplastic elastomer, and a polyether-ester amide-type polyamide-based thermoplastic elastomer.

Examples of such a polyamide-based thermoplastic elastomer may include, but not limited to, "Pebax (trade name)" manufactured by Arkema Inc., "DAIAMID (trade name)" manufactured by Daicel-Evonik Ltd., "VESTAMID (trade name)" manufactured by Daicel-Evonik Ltd., "UBESTA XPA (trade name)" manufactured by UBE INDUSTRIES, LTD., and others. One of them may be used alone or at least two of them may be used in combination.

In a case where the base layer 21 contains a resin different from a thermoplastic elastomer, examples of such a resin may include, but not limited to, polyester, polyamide, polycarbonate, and an acrylic resin. One of them may be used alone or at least two of them may be used in combination. Among them, polyester and/or polyamide are/is preferably used, and specific examples thereof may include, but not limited to, polyesters such as polyethylene terephthalate, polybutylene terephthalate, polyethylene naphthalate, and polybutylene naphthalate, and polyamides such as nylon 6 and nylon 12.

Specifically, "TORAYCON (trade name)" manufactured by TORAY INDUSTRIES, INC. is used as polybutylene naphthalate. This polybutylene terephthalate may be used alone as the base layer 21.

Further, the base layer 21 may contain, in the resin therefor, various additives such as a plasticizer and a softener (e.g., mineral oil), a filler (e.g., carbonate, sulfate, titanate, silicate, oxide (titanium oxide, magnesium oxide), silica, talc, mica, clay, fiber filler), an antioxidant, a light stabilizer, an antistatic agent, a lubricant, and a colorant. One of them may be used alone or at least two of them may be used in combination.

<2-5> Holding Layer

The holding layer 22 is a layer made of, for example, an adhesive material so as to be capable of holding a held component 50. The holding layer 22 may be disposed on only a first surface of the base layer 21 or may be disposed on each of opposite surfaces of the base layer 21. The holding layer 22 may be directly disposed on the base layer 21 or may be disposed above the base layer 21 with another layer interposed between the holding layer 22 and the base layer 21.

In a case where the holding layer 22 is made of an adhesive material, the holding layer 22 preferably has, although not particularly limited, an adhesive force relative to a silicon wafer in a range from 0.1 N/25 mm or more to 10 N/25 mm or less, the adhesive force being measured on condition that the holding layer 22 is applied to a surface of the silicon wafer and, after being left for five minutes, is peeled off the surface of the silicon wafer in a direction of 30° at a peeling speed of 10 mm/min (the measurement is made under environments that a temperature is 23° C. and a relative humidity is 50%, in accordance with, for example, JIS Z0237). The adhesive force falling into the foregoing range ensures favorable adhesion to an object to which the holding layer 22 adheres (i.e., the held component 50). The adhesive force is more preferably in a range from 1 N/25 mm or more to 9 N/25 mm or less, still more preferably in a range from 2 N/25 mm or more to 8 N/25 mm or less.

The thickness of the holding layer 22 (the thickness of only the first surface side of the base layer 21) is not particularly limited. For example, the thickness is preferably in a range from 1 μm or more to 40 μm or less, more preferably in a range from 2 μm or more to 35 μm or less, particularly preferably in a range from 3 μm or more to 25 μm or less.

An adhesive material is not limited as long as it has the foregoing characteristics, and any material may be used. An adhesive material used herein normally contains at least an adhesive main agent. Examples of the adhesive main agent may include, but not limited to, an acrylic adhesive agent, a silicone-based adhesive agent, and a rubber-based adhesive agent. The adhesive material may also contain a crosslinking agent in addition to the adhesive main agent.

The adhesive material may also be an energy ray-curable adhesive material that is curable by energy rays or an energy non-curable adhesive material not curable by energy rays. In a case where the adhesive material is an energy ray-curable adhesive material, the adhesive material is irradiated with energy rays, so that the adhesive material is cured, and the adhesive force thereof is reduced. It is thus possible to prevent an adhesive residue on the held component 50 in separating the held component 50 from the holding layer 22. The type of the energy rays is not limited. Examples of the energy rays may include, but not limited to, ultraviolet rays, electron beams, and infrared rays.

In a case where the adhesive material is an energy ray-curable adhesive material, the adhesive material may contain, in addition to the foregoing adhesive main agent, a compound having a carbon-carbon double bond in a molecule, and a polymerization initiator that reacts with energy rays to initiate polymerization of a curable compound. This curable compound is preferably a monomer, an oligomer and/or a polymer that have/has a carbon-carbon double bond in a molecule and are/is curable through radical polymerization.

<2-6> Other Layers

The holding film 20 may include only the base layer 21 and the holding layer 22. Alternatively, the holding film 20 may include other layers. Examples of the other layers may include, but not limited to, an unevenness absorption layer capable of absorbing the uneven shape of a sticking surface to make a film surface smooth, an interfacial strength improvement layer that improves interfacial strength with the adhesive material, an anti-migration layer that suppresses migration of low molecular weight components from the base layer 21 to the adhesive surface, and an antistatic layer that reduces surface electrical resistance. One of them may be used alone or at least two of them may be used in combination.

<2-7> Placement

The holding film 20 is placed on the frame body 10 while being stretched in at least three different directions. The term "placement" used herein means that the holding film 20 is fixed to the frame body 10 with its stretched state maintained. As a matter of course, the holding film 20 is stretched to an extent that its elastic deformation can be maintained.

The placement may be eventually made in such a manner that the holding film 20 is fixed to the frame body 10 while being stretched. From the viewpoint of preventing heat wrinkles, preferably, the holding film 20 has a larger stretch ratio set to an extent that its elastic deformation can be maintained. In particular, since the base layer 21 has an elastic property as described above, the larger stretch ratio is excellent in terms of minimization of a difference among stretch ratios in the respective stretch directions.

To be specific, preferably, the holding film 20 is placed on the frame body 10 such that stretch ratios measured in three different conformal radial directions with a center P (a graphic center of gravity P) of the opening 10h in the frame body 10 defined as a base point take an average value of 0.3% or more (normally, 5% or less). When the holding film 20 is placed such that the stretch ratios take an average value of 0.3% or more, forces to be loaded are well balanced at the center P of the opening 10h. As a result, heat wrinkles are less likely to be formed on the holding film 20. For example, the stretch ratios may take an average value in a range from 0.34% or more to 3.0% or less, in a range from 0.38% or more to 2.5% or less, in a range from 0.42% or more to 2.0% or less, in a range from 0.46% or more to 1.9% or less, or in a range from 0.5% or more to 1.5% or less.

Figure 9:
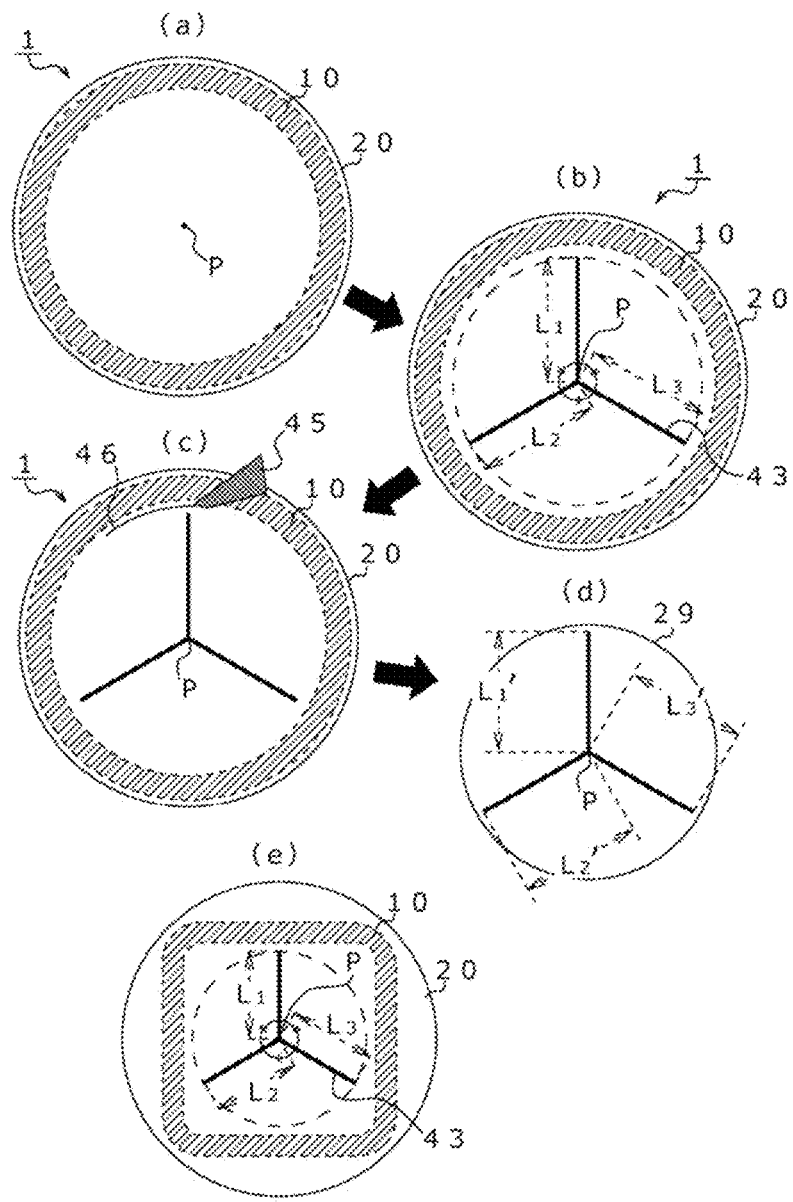
FIG. 9 is an explanatory view that illustrates a method of measuring a stretch ratio of a holding film.

It should be noted that the foregoing stretch ratios are measured by a method illustrated in FIG. 9. Specifically, in a state in which the back surface is held such that no tension is loaded on the holding film 20 placed on the frame body 10 (FIG. 9a), three straight lines 43 are drawn in conformal radial directions from a graphic center relative to an inner peripheral shape of the frame body 10 (FIG. 9b). Using a cutting blade 45, a region between the inner periphery of the frame body 10 and a frame line 41 is cut such that the holding film 20 is not plastically deformed. A part (29) of the holding film 20 placed in the opening 10h of the frame body 10 is thus isolated from the holding film 20. The isolated part 29 of the holding film is mounted on a flat place such that no tension is loaded (FIG. 9d). Stretch ratios ($\{(L_1-L_1')/L_1'\}$, $\{(L_2-L_2')/L_2'\}$, and $\{(L_3-L_3')/L_3'\}$) in the three directions are obtained from a comparison between lengths ($L_1$, $L_2$, $L_3$) of the straight lines 43 in the stretched state illustrated in FIG. 9b and lengths ($L_1'$, $L_2'$, $L_3'$) of the straight lines 43 in the mounted state illustrated in FIG. 9d. A value thus obtained is the stretch ratio in each direction. An average value of values thus obtained is the foregoing average value of the stretch ratios.

The measurement of the stretch ratios and a difference among the stretch ratios can be used irrespective of s shape of a frame body. For example, FIG. 9e illustrates a holding tool 1 including a substantially rectangular frame body. When the foregoing difference among the stretch ratios is satisfactorily small, the holding film is stretched in several directions in manufacturing the holding tool 1. It is thus possible to determine whether biased tension is potentially applied to the holding film irrespective of how the holding film is placed.

In addition, preferably, the holding film 20 is stretched such that stretching forces in more directions are balanced. In other words, preferably, the holding film 20 is stretched in four directions rather than three directions. More preferably, the holding film 20 is stretched in five directions rather than four directions. To be more specific, preferably, the holding film 20 is evenly stretched in at least six directions or in all directions to the frame body. More preferably, the holding film 20 is evenly stretched in at least eight directions or in all directions to the frame body. In addition, preferably, the stretch directions extend conformally. For example, in a case where the holding film 20 is stretched in multiple directions, preferably, the holding film 20 is stretched from the center of a regular polygon toward the respective vertexes of the regular polygon with the center of the regular polygon defined as the foregoing center P.

To be specific, preferably, the holding film 20 is placed on the frame body 10 such that a difference among the stretch ratios measured in three different conformal radial directions with the center P (the graphic center of gravity P) of the opening 10h in the frame body 10 defined as a base point is 0.4% or less (alternatively, the difference may be 0%). When the holding film 20 is placed such that the difference among the stretch ratios is 0.4% or less, forces to be loaded are well balanced at the center P of the opening 10h. As a result, heat wrinkles are less likely to be formed on the holding film 20. For example, the difference among the stretch ratios may be in a range from 0% or more to 0.4% or less, in a range from 0% or more to 0.35% or less, in a range from 0% or more to 0.32% or less, in a range from 0% or more to 0.30% or less, or in a range from 0% or more to 0.28% or less.

It should be noted that the stretch ratios at the time when the holding film 20 is stretched are not necessarily equal to the stretch ratios of the holding film 20 placed on the frame body 10. Preferably, the stretch ratios of the holding film 20 placed on the frame body 10 are eventually equal to one another.

In the foregoing holding tool forming step R10, the holding film 20 may be placed on the frame body 10 in any manner. The holding tool forming step R10 normally includes: a stretching step R101 of stretching the holding film 20 or the plain film 201 as the holding film; and a fixing step R102 of fixing the holding film 20 or the plain film 201 to the frame body 10 such that the stretched state is maintained. In the case of using the plain film 201, the holding tool forming step R10 may further include, subsequent to the fixing step R102, an isolating step R103 of isolating the unnecessary portion 202 from the plain film 201 to obtain the holding film 20.

It should be noted that the plain film 201 is a film from which the holding film 20 is formed in such a manner that the unnecessary portion 202 is isolated therefrom. An example of the plain film may include, but not limited to, a raw film.

<2-8> Stretching Step

The stretching step R101 is a step of stretching the holding film 20 or the plain film 201. In the stretching step R101, the holding film 20 or the plain film 201 may be stretched in any form as long as the holding film 20 or the plain film 201 is eventually stretched in at least three different directions or in all directions to the frame body. For example, in a case where a film is stretched with its one end fixed whereas the other end pulled, this film refers to a film stretched in two different directions in the present specification. In other words, in a case where a force is loaded in two directions irrespective of whether a film is actually tensed, it can be said that the film is stretched in two directions. As a matter of course, the same thing may hold true for each of more than two directions.

In order to form the holding film 20 stretched in three different directions, accordingly, the stretching step R101 may selectively include pulling the holding film 20 from the three different directions, pulling the holding film 20 from two positions while fixing the holding film 20 at one position, or pulling the holding film 20 from one position while fixing the holding film 20 at two positions. Likewise, the same thing may hold true for a case of forming a holding film 20 stretched in at least four different directions.

However, since the holding film 20 is an elastic film as described above, as the number of stretch directions is small, a length of the holding film 20 stretched in each direction becomes long. This is inconvenient in terms of a process or in terms of a device. For this reason, preferably, the number of stretch directions is larger. From this viewpoint, preferably, the holding film 20 is evenly stretched in at least six directions or in all directions to the frame body. More preferably, the holding film 20 is evenly stretched in at least eight directions or in all directions to the frame body. In addition, preferably, the stretch directions extend conformally. For example, in a case where the holding film 20 is stretched in multiple directions, preferably, the holding film 20 is stretched from the center of a regular polygon toward the respective vertexes of the regular polygon (i.e., centrifugally) with the center of the regular polygon defined as the foregoing center P.

For the foregoing reason, in the present method, more preferably, the film is stretched with the film fixed in a plane (X-Y) direction and pushed in a Z-axis direction.

Preferably, the stretching step R101 includes pushing the holding film 20 or the plain film 201 from the base layer 21 side to bring about the stretched state. Particularly preferably, the stretching step R101 includes stretching the holding film 20 or the plain film 201 by pushing the holding film 20 or the plain film 201 with a push jig 252 while fixing the holding film 20 or the plain film 201 with a frame-shaped fixing jig 251 (see FIG. 2). It is thus possible to reduce a mechanical operation distance and to precisely and efficiently stretch a film.

As a matter of course, in pushing the holding film 20 or the plain film 201, the holding film 20 or the plain film 201 may be stretched by moving any of the push jig 252 and the holding film 20 (or the plain film 201). That is, the film may be pushed in such a manner that only the push jig 252 is moved in the Z-axis direction while the film is fixed. Alternatively, the film may be pushed in such a manner that only the film is moved in the Z-axis direction while the push jig 252 is fixed. Still alternatively, the film may be pushed in such a manner that the film and the push jig 252 are mutually moved in the Z-axis direction so as to come close to each other.

In the case where the stretching step R101 is a step of pushing the holding film 20 or the plain film 201 from the base layer 21 side with the push jig 252 to stretch the holding film 20 or the plain film 201, preferably, a contact area of the push jig 252 with the holding film 20 or the plain film 201 is larger.

To be specific, in the case of using the frame-shaped fixing jig 251, preferably, the push jig 252 has a contact area corresponding to more than 50% (even 100%) of its opening area (an area of an inner opening in the frame-shaped fixing jig 251. When the contact area ratio is 50% or more, it is possible to reduce a mechanical operation distance and to precisely and efficiently stretch a film. This contact area ratio is preferably 70% or more, more preferably 80% or more.

In addition, preferably, the push jig 252 has an outer edge 252a (a contact outer edge) with which the holding film 20 or the plain film 201 is brought into contact. The outer edge 252a may have any shape. Preferably, the outer edge 252a has a substantially circular shape. Specifically, the push jig 252 may have, for example, a columnar end shape or a cylindrical end shape. In the case of the columnar end shape, the contact surface has a circular shape. In the case of the cylindrical end shape, the contact surface has a cylindrical shape. Although the contact surfaces in the respective cases are different in shape from each other, the contact outer edge 252a has a circular shape in both the cases. In the case where the push jig 252 has the substantially circular contact outer edge 252a with which the holding film 20 or the plain film 201 is brought into contact and particularly in the case where the center of the contact outer edge 252a agrees with the center of the opening in the frame-shaped fixing jig 251, the film can be evenly stretched, which is therefore preferable.

Preferably, the stretching step R101 includes fixing the holding film 20 or the plain film 201 with the frame-shaped fixing jig 251 having the substantially circular opening shape, and stretching the holding film 20 or the plain film 201 by pushing the holding film 20 or the plain film 201 with the push jig 252 having the contact area corresponding to 50% of the opening area of the fixing jig 251 and also having the substantially circular contact outer edge 252a.

It is specifically assumed herein that the fixing jig 251 is, for example, a ring-shaped fixing jig 251 having an opening 251h of which the diameter is 30 cm. In this case, in order to place the film (the holding film 20 or the plain film 201) such that the stretch ratios measured in three different conformal radial directions with the center P of the opening 10h in the frame body 10 defined as a base point take an average value of 0.3% or more as described above, first, a state in which the film is placed on the fixing jig 251 without being stretched (i.e., a state in which the film is not loosened and stretched in the opening 251h) is defined as a reference, and then a region corresponding to more than 50% of an area of the film covering the opening 251*h* is pushed down by 0.5 mm or more (normally, 20 mm or less), so that the foregoing state can be achieved. As a matter of course, it suffices to bring about a stretched state to the same extent; therefore, the film can be stretched regardless of the foregoing shape and method.

In the case of stretching the film as described above, preferably, the film is stretched in such a manner that particularly a region corresponding to 85% of the area of the film covering the opening 251*h* is pushed down in a range from 1 mm or more to 15 mm or less. More preferably, the film is stretched in such a manner that this region is pushed down in a range from 1.5 mm or more to 10 mm or less. Particularly preferably, the film is stretched in such a manner that this region is pushed down in a range from 2 mm or more to 8 mm or less.

Preferably, the contact outer edge 252*a* of the push jig 252 is subjected to low friction processing capable of reducing friction between the push jig 252 and the holding film 20 or the plain film 201. Specific examples of the push jig 252 may include, but not limited to, a push jig 252 having a contact outer edge 252*a* made of fluororesin, and a push jig 252 entirely made of fluororesin.

<2-9> Fixing Step

The fixing step R102 is a step of fixing the film (the holding film 20 or the plain film 201) stretched in the stretching step R101 to the frame body 10 such that the stretched state is maintained (see FIG. 3).

It should be noted that the maximum stretch ratio of the holding film 20 or the plain film 201 in the stretching step R101 does not necessarily agree with the stretch ratio of the holding film 20 or the plain film 201 fixed to the frame body 10.

The film may be fixed by any method. Examples of the fixing form may include, but not limited to, (1) the film is fixed to the frame body 10 by adhesion, (2) the film is fixed to the frame body 10 by welding, and (3) the film is fixed to the frame body 10 with the film sandwiched between engagement portions of the frame body 10. One of the fixing forms may be used alone or at least two of the fixing forms may be used in combination.

The foregoing fixing form (1) can be used in a case where, for example, the holding layer 22 has adhesion. That is, the film can be fixed to the frame body 10 by this adhesion.

The foregoing fixing form (2) is preferred in a case where the frame body 10 is made of resin. That is, the film in the stretched state can be fixed to the frame body 10 by welding in such a manner that the film is heated. The foregoing fixing form (2) is effective in a case where the fixing form (1) is difficult to use. The fixing form (1) and the fixing form (2) may be used in combination. That is, for example, the film is temporarily fixed to the frame body 10 by adhesion, and then the film can be fixed to the frame body 10 by welding.

The foregoing fixing form (3) is preferred in a case where the frame body 10 includes multiple components that are engageable. That is, in the case where the frame body 10 includes multiple components that are engageable, the film is inserted between the engageable components while being stretched before the components are engaged with each other, and then the film can be held on the frame body 10 while being stretched in such a manner that the components are engaged with each other. More specifically, in a case of using a frame body 10 including a ring-shaped inner frame 111 and a ring-shaped outer frame 112 engageable with an outer periphery of the inner frame 111, the film is sandwiched between the inner frame 111 and the outer frame 112 while being stretched. When the inner frame 111 and the outer frame 112 are engaged with each other, the film can be held on the frame body 10 while being stretched.

The fixing form (1) and the fixing form (3) may be used in combination. For example, the film is temporarily fixed to the inner frame 111 by adhesion, and then the outer frame 112 can be engaged with the inner frame 111.

<2-10> Isolating Step

Figure 4:
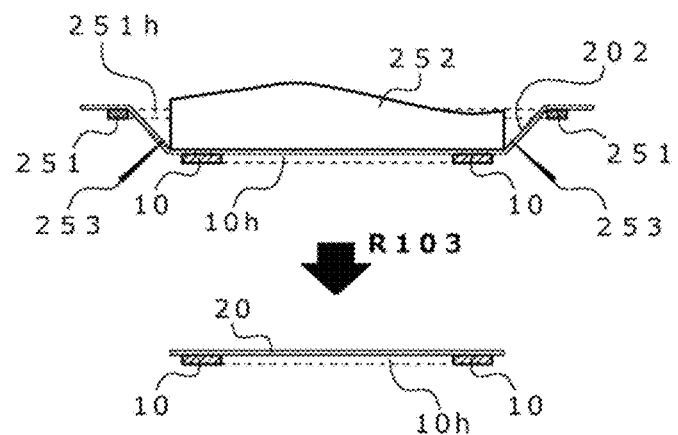
FIG. 4 is an explanatory view that illustrates an isolating step in the present component manufacturing method.

The isolating step R103 is a step of, in a case where the plain film 201 is used in the stretching step R101 and the fixing step R102, isolating the unnecessary portion 202 from the plain film 201 to obtain the holding film 20 (see FIG. 4).

The holding film 20 may be of an appropriate size from which no unnecessary portion 202 generates. Alternatively, the holding film 20 may be formed from a plain film 201 from which an unnecessary portion 202 generates. An example of the plain film 201 may include, but not limited to, a raw film wound in the form of a roll. The unnecessary portion 202 may be appropriately cut by, for example, a known method.

<2-11> Other Steps

The present component manufacturing method may include other steps in addition to the holding tool forming step R10, the stretching step R101, the fixing step R102, and the isolating step R103. Examples of the other steps may include, but not limited to, a holding step R1*l*, a chucking step R12, an evaluation step R13, a dividing step R14, a separating step R15, and a pickup step R16. One of the steps may be used alone or at least two of the steps may be used in combination.

<2-12> Holding Step

The holding step R11 is a step of holding the held component 50 on the holding layer 22 of the film (the holding film 20 or the plain film 201). More specifically, the holding step R11 is a step of holding the precursor (the held component 50) in the stretched region of the plain film 201 in the holding tool forming step R10 or a step of holding the precursor (the held component 50) on the holding film 20 of the holding tool 1 obtained in the holding tool forming step R10. As described above, a specific method of holding the held component 50 is not limited as long as the held component 50 is held in the stretched region of the film. Typically, using a holding layer 22 having adhesion, the held component 50 can be held on the holding layer 22 by adhesion.

As described above, the holding step R11 may be carried out after the holding tool forming step R10 or may be carried out in the holding tool forming step R10.

Figure 10:
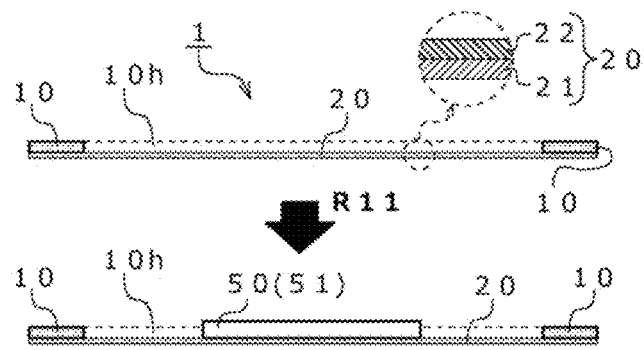
FIG. 10 is an explanatory view that illustrates a holding step in the present component manufacturing method.

An example of the case where the step R1*l* is carried out after the step R10 may include a case of holding the held component 50 on the holding film 20 of the obtained holding tool 1 (see FIG. 10).

Figure 11:
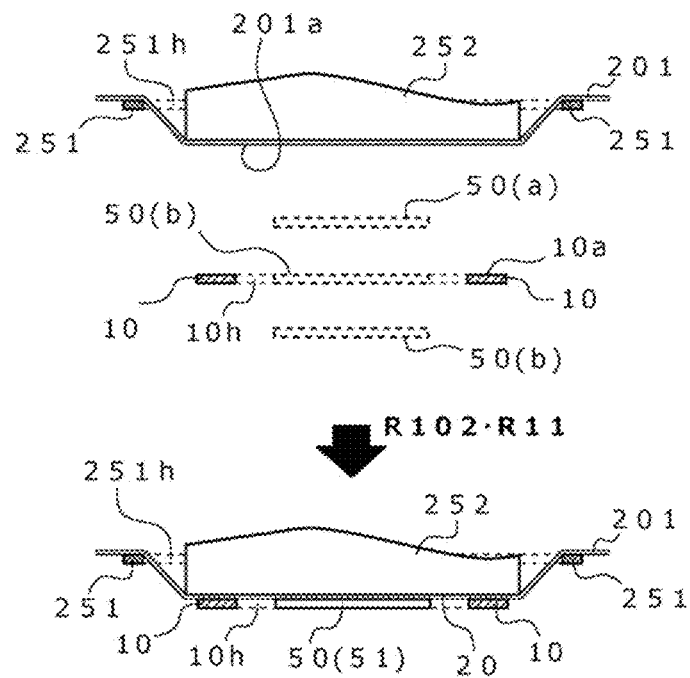
FIG. 11 is an explanatory view that illustrates the fixing step and the holding step in the present component manufacturing method.

On the other hand, examples of the case where the step R11 is carried out in the step R10 include the following cases (1) to (3):

(1) a case where a held component 50*a* is held in the stretched region of the plain film 201, and then the plain film 201 on which the held component 50*a* is held is fixed to the frame body 10 (in the processing order of step R101→step R11→step R102) (see FIG. 11);

(2) a case where the stretched plain film 201 is fixed to the frame body 10 and, at the same time, a held component 50*b* is held in the stretched region of the plain film 201 (in the processing order of step R101→step R11 and step R102) (see FIG. 11); and (3) a case where the plain film 201 in the stretched state is fixed to the frame body 10, and then a held component 50c is held in the stretched region of the plain film 201 before the unnecessary portion 202 is isolated from the plain film 201 (in the processing order of step R101 →step R102→step R11) (see FIG. 11).

<2-13> Chucking Step

Figure 12:
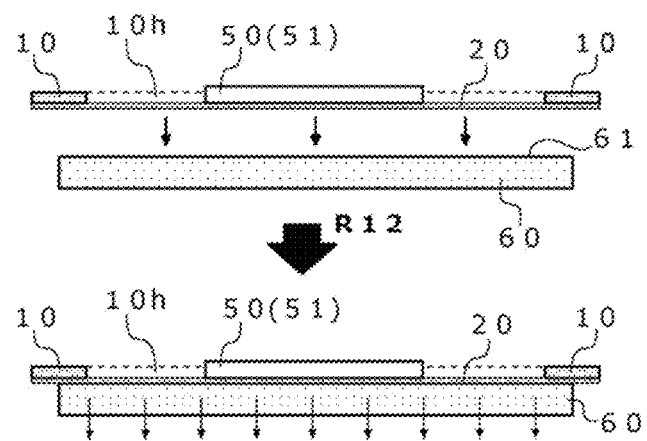
FIG. 12 is an explanatory view of a chucking step in the present component manufacturing method.
Figure 16:
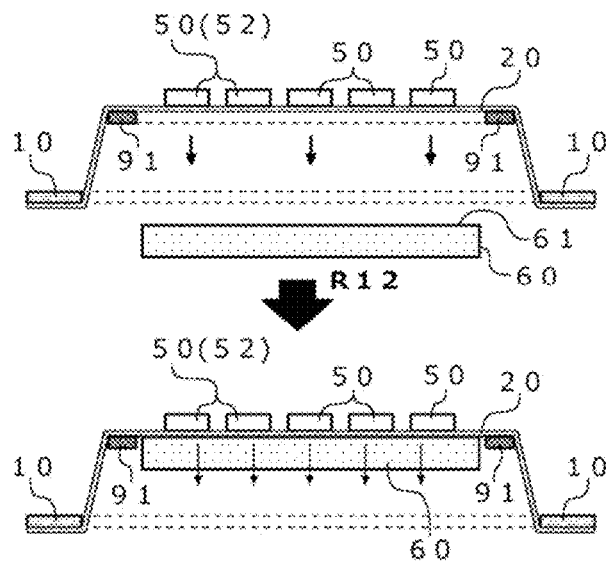
FIG. 16 is an explanatory view of the chucking step in the present component manufacturing method.

The chucking step R12 is a step of, after the holding step R11, chucking the holding film 20 on which the held component 50 is held, to a surface 61 of the chuck table 60 that is heated, from the base layer 21 side (see FIGS. 12 and 16). FIG. 12 illustrates a case where the held component 50 is a primary precursor 51. On the other hand, FIG. 16 illustrates a case where the held component 50 is a secondary precursor (a divided component) 52. The chucking step R12 is normally carried out at least once or may be carried out twice or more in all the processes for manufacturing a component. In other words, the chucking step R12 may be carried out at the stage in which the held component 50 is a primary precursor 51. Alternatively, the chucking step R12 may be carried out at the stage in which the held component 50 is a secondary precursor (a divided component) 52. In all the processes for manufacturing a component, the chucking step R12 may be carried out in one of the foregoing cases or may be carried out in both the foregoing cases.

In addition, any step may be carried out after the chucking step R12. Typically, the evaluation step R13 may be carried out after the chucking step R12.

Figure 21:
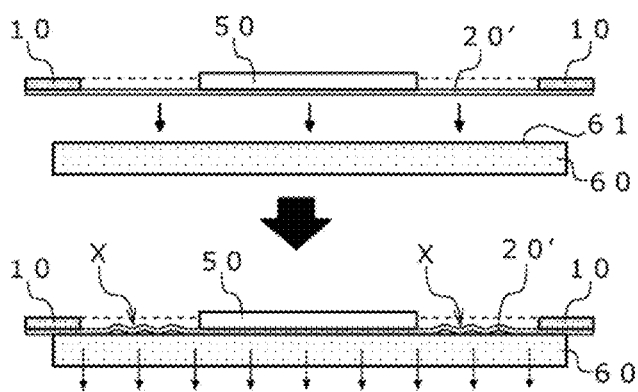
FIG. 21 is an explanatory view that illustrates a problem of a conventional holding tool.

In a conventional holding tool, as described above, when a holding tool is chucked and fixed to a heated chuck table 60, wrinkles X are sometimes formed on a holding film 20' (see FIG. 21). The wrinkles X cause chucking leak, which hinder normal chucking of the holding tool to the chuck table 60. The wrinkles X also cause surface irregularities on a surface of the holding film 20. Consequently, a held component 50 wobbles while following the surface irregularities. As a result, there is a possibility that a probe fails to normally come into contact with the held component 50 in an evaluation step.

In contrast to this, the present method, the present holding film, and the present device prevent formation of wrinkles X, allow the holding tool 1 to be normally chucked and fixed to the chuck table 60, and also prevent the foregoing problem in the evaluation step.

The chuck table 60 (see FIGS. 12 and 16) for use in the chucking step R12 includes a table (a top plate) having a smooth top surface 61. Chucking causes the holding film 20 on which the held component 50 is held to come into contact with the top surface 61 on the base layer 21 side. The chuck table 60 may have any suction structure. Examples of the suction structure may include, but not limited to, a molded body (e.g., a metal molded body, a ceramic molded body, a resin molded body) having a suction route such as a suction hole or a suction groove, or a porous molded body (e.g., a metal molded body, a ceramic molded body, a resin molded body). It should be noted that the porous molded body has, as a suction route, a hole communicating with the front and back sides of the chuck table (i.e., a communication hole) and/or a hole passing through the chuck table from the front side to the back side (i.e., a through hole). The smooth top surface 61 means that the top surface 61 is smooth except the foregoing suction route.

In addition, the chuck table 60 that is heated means a state in which the chuck table 60 is heated to a temperature higher than the temperature of an operating environment. It is specifically assumed that the chuck table 60 is in a preheated state or the chuck table 60 continuously chucks the holding tool 1 without being satisfactorily cooled in order to increase a time cycle. It is particularly assumed in the present method that the surface 61 of the chuck table 60 is heated to 70° C. or more. The temperature of the surface 61 is normally 200° C. or less. The temperature of the surface 61 may be in a range from 75° C. or more to 190° C. or less, in a range from 80° C. or more to 180° C. or less, in a range from 85° C. or more to 170° C. or less, or in a range from 90° C. or more to 160° C. or less.

The chucking step R12 in the present method is carried out for the heated chuck table 60. A step R12' of chucking the holding film 20 to the chuck table that is not heated can be carried out separately from the chucking step R12 in the present method as appropriate. For example, the step R12' may be carried out before the dividing step R14. That is, it is considered that, for example, the primary precursor 51 is chucked and fixed to the chuck table, and then is divided.

<2-14> Evaluation Step

Figure 13:
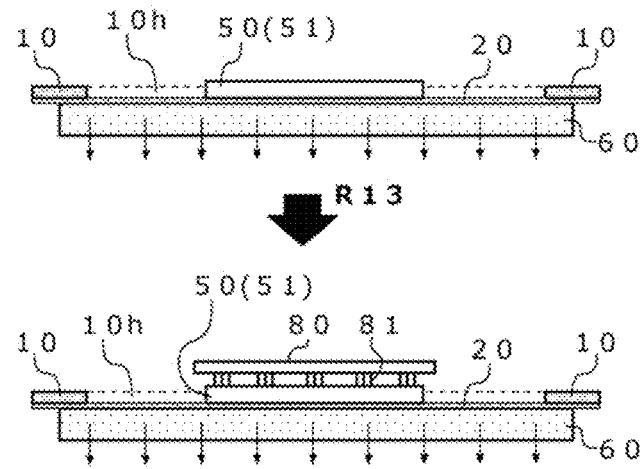
FIG. 13 is an explanatory view of an evaluation step in the present component manufacturing method.
Figure 17:
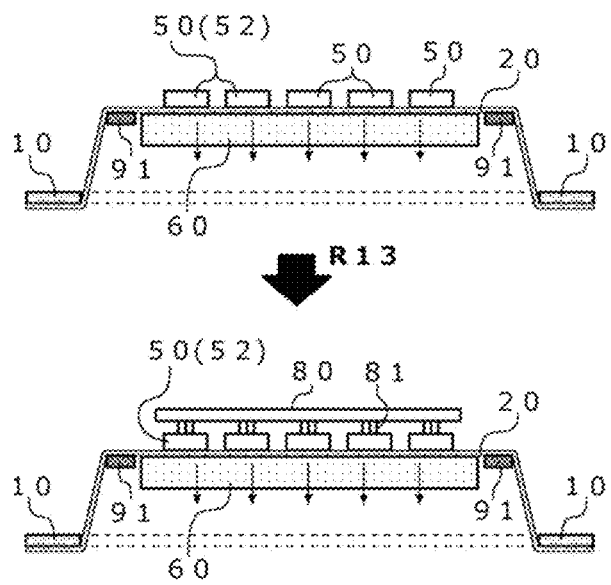
FIG. 17 is an explanatory view of the evaluation step in the present component manufacturing method.

The evaluation step R13 is a step of evaluating the held component 50 held on the holding film 20 (see FIGS. 13 and 17). The evaluation step R13 is normally carried out after the chucking step R12. Evaluation contents in the evaluation step R13 may include, for example, evaluation using a probe as to whether an electrical characteristic of a circuit on the held component 50 (the primary precursor 51 or the secondary precursor 52) is capable of exerting a required characteristic in a predetermined temperature range (e.g., 100° C. or more, 170° C. or less); however, the evaluation contents are not limited thereto. The evaluation contents may also include evaluation for the sake of an accelerated endurance test in a desired temperature range (e.g., a burn-in test). In the evaluation step R13, one of the evaluation contents may be used alone or at least two of the evaluation contents may be used in combination.

More specifically, for example, a probe card 80 on which a plurality of probes 81 are formed is brought into contact with a predetermined corresponding portion of the held component 50 (the primary precursor 51 or the secondary precursor 52) to make electrical connection, so that correctness of a signal exchanged between the probe 81 and the circuit formed on each component 50 is determined (probe test) (see FIGS. 13 and 17). The evaluation may be non-contact optical evaluation in addition to the electrical evaluation (probe test) conducted by bringing the probes into contact with the held component 50 as described above. One of them may be used alone or both of them may be used in combination.

<2-15> Dividing Step

Figure 14:
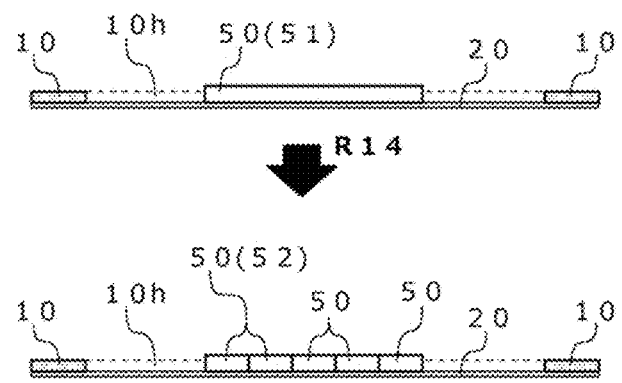
FIG. 14 is an explanatory view of a dividing step in the present component manufacturing method.

The dividing step R14 is a step of dividing the primary precursor 51 to obtain secondary precursors 52 (divided components) (see FIG. 14). Normally, after the holding step R11, the held component 50 (the primary precursor 51) is divided while being held on the holding film 20 to obtain the divided components (the secondary precursors 52). Specific examples of the dividing step R14 may include, but not limited to, a step of dividing a semiconductor wafer (a primary precursor 51) to obtain precursors (secondary precursors 52) of semiconductor components, and a step of dividing an array-shaped electronic component (a primary precursor 51) to obtain precursors (secondary precursors 52) of semiconductor components. The dividing step R14 may be carried out by a conventionally known method and means as appropriate.

<2-16> Separating Step

Figure 15:
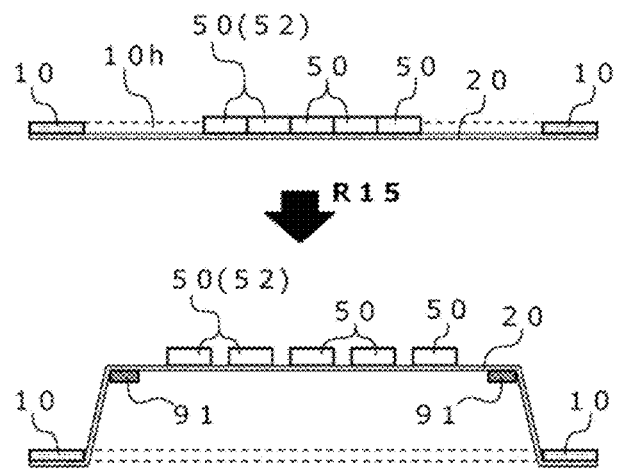
FIG. 15 is an explanatory view of a stretching step in the present component manufacturing method.
Figure 19:
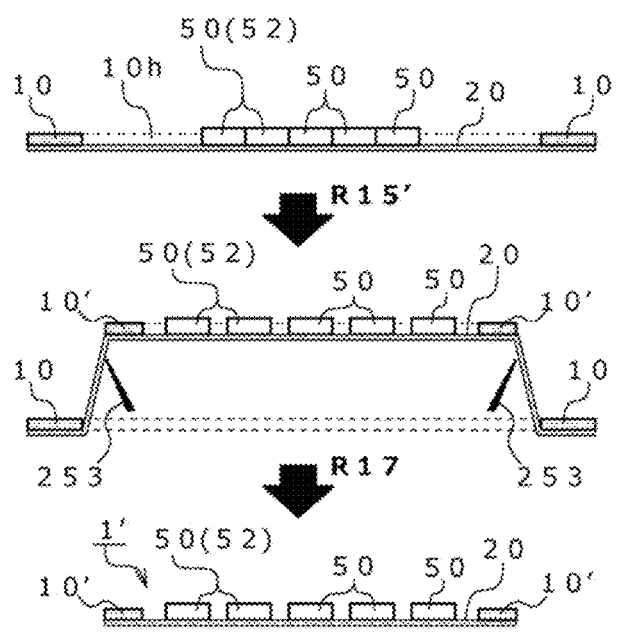
FIG. 19 is an explanatory view of a secondary holding tool preparing step in the present component manufacturing method.

The separating step R15 (the separating step in FIG. 19 is denoted with R15') is a step of further stretching the holding film 20 to separate the held components 50 on the holding film 20 from each other (see FIGS. 15 and 19). The held components 50 held on the holding film 20 in the separating step are normally divided components 52 (secondary precursors 52).

The step R15 is carried out for improving a pickup property by separating the held components 50 from each other in advance before the pickup step R16 is carried out. Specifically, a stopper 91 (which may alternatively be another frame body smaller in diameter than the frame body 10) is brought into contact with the base layer 21 side of the holding film 20, and the frame body 10 is pushed down (or the stopper 91 is pushed up), so that the holding film 20 in the region in the opening 10h can be further stretched.

<2-15> Pickup Step

Figure 18:
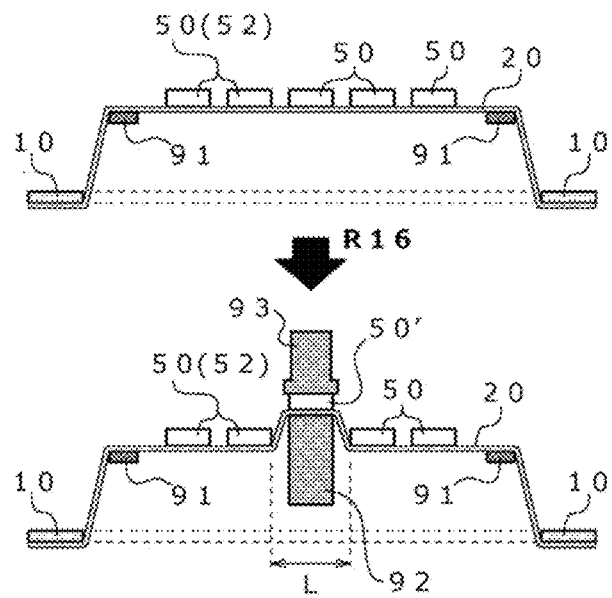
FIG. 18 is an explanatory view of a pickup step in the present component manufacturing method.

The pickup step R16 is a step R16 of, in a case where the divided components 52 (i.e., the held components 50, the secondary precursors 52) are held on the holding film 20 after the chucking step R12, pushing some of the divided components 52, that is, divided components 52' from the base layer 21 side toward the holding layer 22 side to further stretch the holding film 20, and picking up the divided components 52' while separating the divided components 52' from the divided components 52 (see FIG. 18). The actual pickup may be performed in such a manner that the pushed held components 50' are sucked by a pickup tool 93.

The holding film 20 of the holding tool 1 for use in the present method has the characteristics of $0.2 \leq R_{E1} \leq 1$ and 35 MPa $\leq E'(25) \leq$ 1500 MPa. In the pickup step, therefore, only a target to be picked up, that is, a portion, where the held components 50' are placed, of the holding film 20 can be deformed largely. That is, it is possible to decrease an area of a peripheral film pushed up by the push-up member 92, and to reduce a diameter L (see FIG. 18) of a portion lifted as the film is pushed up. It is thus possible to prevent a problem of, for example, unintentional lift of a held component 50 not to be picked up. In a film that cannot maintain sufficient flexibility, an area of a peripheral film that is unintentionally lifted as the film is pushed up is large. Therefore, another held component 50 (a component not to be picked up) adjacent to a held component 50' to be picked up is simultaneously lifted or is lifted while being inclined, which may result in a problem such as collision between held components. In this respect, the present method uses the present holding tool 1, and is therefore capable of preventing such a problem.

In the present component manufacturing method, the frame body 10 may be used through all the steps. Alternatively, subsequent steps may be continued with the frame body 10 exchanged with a new one.

Specifically, since the holding film 20 for use in the present method has excellent stretchability, the holding film 20 is stretched as required, and the frame body 10 may be replaced with a frame body 10' smaller than the frame body 10. For example, it is possible to obtain a secondary holding tool 1' on which a holding film 20 (which holds on its surface a held component 50) is placed. The holding film 20 is further stretched as follows. That is, the dividing step R14 is carried out using the frame body 10 (see FIG. 14), and then the separating step R15' is carried out (see FIG. 19). At this time, the holding film 20 is placed on the frame body 10', and an unnecessary portion is removed from the holding film 20 with a cutting blade 253. That is, the frame body exchange step R17 (see FIG. 19) can be carried out if necessary. In this case, the foregoing stretching method (see FIG. 2) and isolating step (see FIG. 4) are usable.

[2] Holding Film

The holding film 20 according to the present invention is, as described above, a holding film for use in the component manufacturing method according to the present invention. That is, the holding film 20 includes: the base layer 21; and the holding layer 22 disposed on the first surface side of the base layer 21. The ratio $R_{E1}$ (=E'(100)/E'(25)) of the elastic modulus E'(100) of the base layer 21 at 100° C. to the elastic modulus E'(25) of the base layer 21 at 25° C. is in the range of $0.2 \leq R_{E1} \leq 1$. The elastic modulus E'(25) is in the range from 35 MPa or more to 1500 MPa or less. The base layer 21 of the holding film 20 may have a linear thermal expansion coefficient of 100 ppm/K or more. Furthermore, the base layer 21 may contain at least one of a thermoplastic polyester-based elastomer, a thermoplastic polyamide-based elastomer, or a polybutylene terephthalate.

[3] Holding Tool Forming Device

Figure 20:
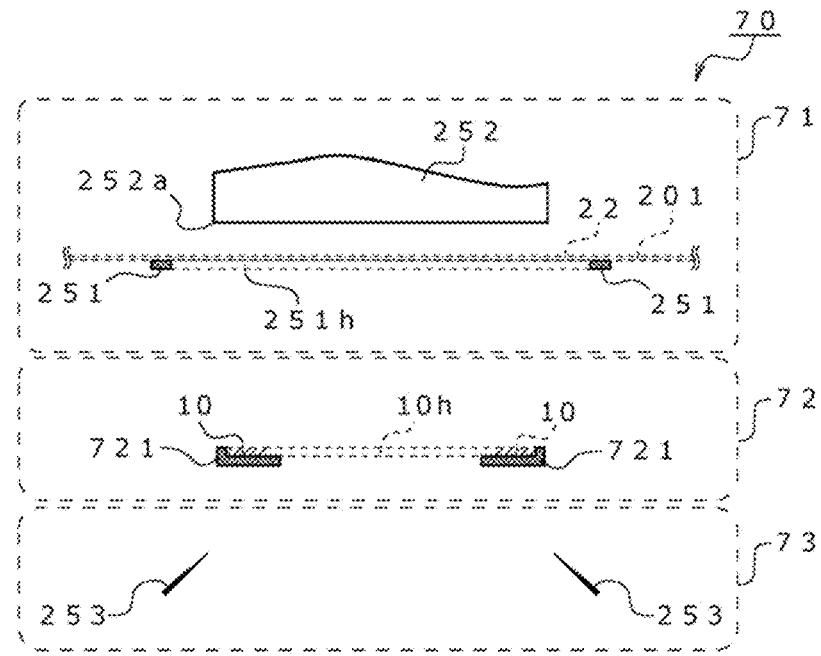
FIG. 20 is an explanatory view that illustrates the present holding tool forming device.

A holding tool forming device 70 according to the present invention is a device that forms the holding tool 1, and includes a stretching mechanism 71, a fixing mechanism 72, and an isolating mechanism 73 (see FIG. 20). It should be noted that the device 70 includes the stretching mechanism 71 and the fixing mechanism 72, but does not necessarily include the isolating mechanism 73.

Figure 2:
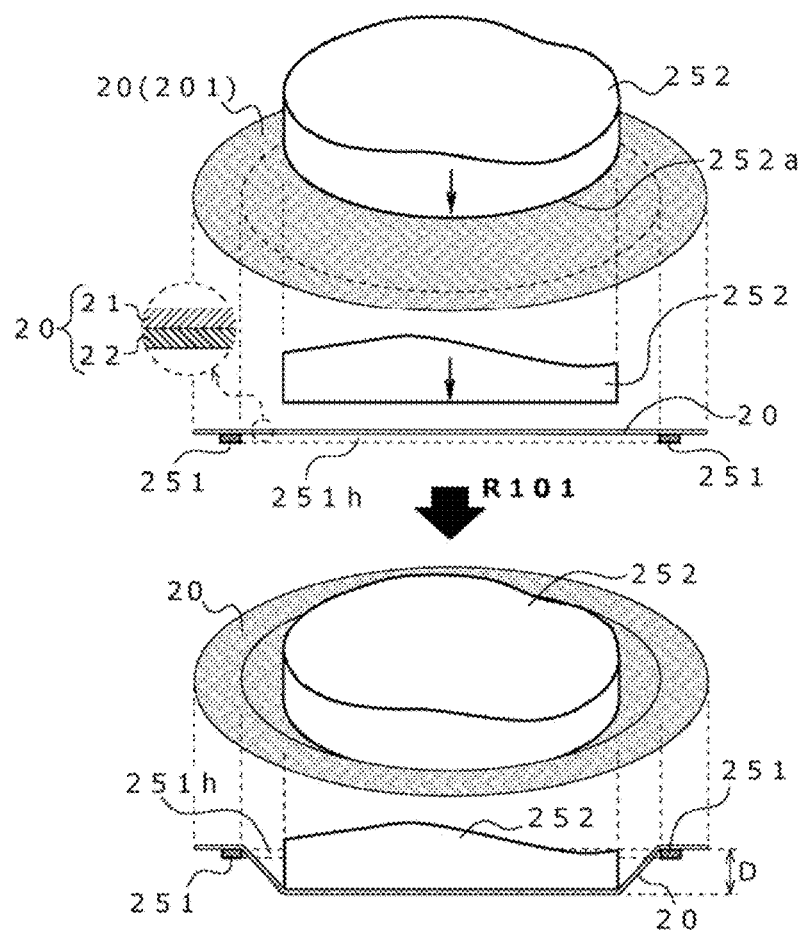
FIG. 2 is an explanatory view that illustrates a stretching step in the present component manufacturing method.

The stretching mechanism 71 is a mechanism that pushes the plain film 201 from the base layer 21 side to bring about a stretched state (see FIG. 2).

The fixing mechanism 72 is a mechanism that fixes the plain film 201 to the frame body 10 such that the stretched state is maintained (see FIG. 3).

The isolating mechanism 73 is a mechanism that isolates the unnecessary portion 202 from the plain film 201 to obtain the holding film 20 (see FIG. 4).

A holding tool 1 to be formed is the same as that described above.

The stretching mechanism 71 may include, for example, a fixing jig 251 that fixes the plain film 201, and a push jig 252 that pushes the plain film 201 from the base layer 21 to stretch the plain film 201 (see FIGS. 20 and 2).

For example, the fixing jig 251 may be a frame-shaped fixing jig 251 as described above; however, the configuration of the fixing jig 251 is not limited thereto. Preferably, the opening 251h has a substantially circular shape; however, the specific frame shape is not limited thereto. The fixing jig 251 fixes the plain film 201 with the holding layer 22 placed on a surface thereof. In order to fix the plain film 201 more rigidly, as in the form of the frame body 10 illustrated in FIGS. 6 to 8, the plain film 201 can be fixed while being sandwiched between an inner frame and an outer frame or between an upper frame and a lower frame.

In stretching the plain film 201, the plain film 201 is only required to be eventually stretched. The plain film 201 may be pushed in such a manner that one of the push jig 252 and the plain film 201 is fixed while the other is moved or may be pushed in such a manner that both the push jig 252 and the plain film 201 are moved. The contact area of the push jig 252 is the same as that described above. As in the case described above, preferably, the contact outer edge 252a of the push jig 252 has a substantially circular shape. Also as in the case described above, preferably, the contact outer edge 252a of the push jig 252 is subjected to low friction processing capable of reducing friction between the push jig 252 and the plain film 201.

The fixing mechanism 72 may include, for example, a frame body jig 721 that holds or moves the frame body 10 (see FIG. 20). The fixing mechanism 72 is not limited as long as it is capable of fixing the plain film 201 to the frame body 10 such that the stretched state of the plain film 201 is maintained. For example, an appropriate mechanism may be used in accordance with a configuration of a frame body 10 to be used (see FIG. 3).

The isolating mechanism 73 may include, for example, a cutting blade 253 for isolating the unnecessary portion 202 (see FIGS. 20 and 4). The isolating mechanism 73 is only required to isolate the unnecessary portion 202 from the plain film 201, thereby obtaining the holding film 20. For example, the isolating mechanism 73 may have an appropriate configuration.

In addition, the present device 70 may include other mechanisms in addition to the foregoing respective mechanisms. An example of the other mechanisms may include, but not limited to, a holding mechanism for holding the precursor 50 (the held component 50) in the stretched region 201*a* of the plain film 201 (see FIG. 11).

EXAMPLES

The present invention will be described in detail below by way of examples.
[1] Manufacture of Holding Tool
<1> Manufacture of Film Experimental Examples 1 and 2

(1) Base Layer

Two kinds of polybutylene terephthalate (PBT) films having a thickness of 110 μm were prepared as a base layer 21. As to each of the films, a tensile elastic modulus E' was measured with a dynamic viscoelasticity measurement apparatus (DMA: Dynamic Mechanical Analysis) (product name: RSA-3, manufactured by TA Instruments, Inc.). Specifically, the tensile elastic modulus E' was measured in a temperature range from −50° ° C. to 200° ° C. on measurement conditions that a sample size is 10 mm in width and 20 mm in length between chucks, a frequency is 1 Hz, and a heating rate is 5° C./min, and data on each temperature is read from data thus obtained. A value at 25° C. was defined as a tensile elastic modulus E'(25), and a value at 100° C. was defined as a tensile elastic modulus E'(100). In addition, a value of a ratio $R_{E1}$ (=E'(100)/E'(25)) was calculated using these values.

In Experimental Example 1, as a result, the base layer 21 had relations of E'(25)=1320 MPa, E'(100)=161 MPa, and $R_{E1}$=0.12. It should be noted that the PBT film used in Experimental Example 1 has a linear thermal expansion coefficient of 178 ppm/K.

In Experimental Example 2, on the other hand, the base layer 21 had relations of E'(25)=550 MPa, E'(100)=138 MPa, and $R_{E1}$=0.25. It should be noted that the PBT film used in Experimental Example 2 has a linear thermal expansion coefficient of 188 ppm/K.

(2) Holding Layer

A holding layer 22 used herein was an ultraviolet curable acrylic adhesive agent having a thickness of 20 μm.

(3) Lamination of Base Layer and Holding Layer

A holding film 20 in each of Experimental Examples 1 and 2 was obtained by laminating the holding layer 22 described above in (2) on a first surface of the base layer 21 described above in (1).

In addition, an adhesive force of the resultant holding film 20 in each of Experimental Examples 1 and 2 was measured in accordance with JIS Z0237. Specifically, a test piece obtained by cutting the holding film 20 in each of Experimental Examples 1 and 2 into a width of 25 mm was affixed onto a silicon wafer while being pressed against the silicon wafer with a rubber roll (about 2 kg). Next, the test piece was left for 5 minutes at a temperature of 23° C. in a relative humidity of 50%. Thereafter, an adhesive force generated at the time of peeling the test piece off the silicon wafer in a direction of 30° at a peeling speed of 10 mm/min was measured. The measurement was conducted twice, and an average value was calculated. As a result, the holding film 20 in each of Experimental Examples 1 and 2 had an adhesive force of 5.6 N/25 mm.

Experimental Example 3

(1) Base Layer

A base layer 21 prepared herein was a polyester-based thermoplastic elastomer (TPEE) film having a thickness of 110 μm. As to this film, a tensile elastic modulus E' was measured in a manner similar to that in Experimental Examples 1 and 2. In Experimental Example 3, as a result, the base layer 21 had relations of E'(25)=56 MPa, E'(100)=32 MPa, and $R_{E1}$=0.57. It should be noted that the TPEE film in Experimental Example 3 has a linear thermal expansion coefficient of 220 ppm/K.

(2) Holding Layer

A holding layer 22 used herein was an ultraviolet curable acrylic adhesive agent having a thickness of 20 μm.

(3) Lamination of Base Layer and Holding Layer

A holding film 20 in Experimental Example 3 was obtained by laminating the holding layer 22 described above in (2) on a first surface of the base layer 21 described above in (1). The holding film 20 in Experimental Example 3 had an adhesive force of 5.6 N/25 mm measured in a manner similar to that in Experimental Example 1.

TABLE 1

|  |  | Experimental Example No. | | |
|---|---|---|---|---|
|  |  | 1 | 2 | 3 |
| Base layer | Resin | PBT (1) | PBT (2) | TPEE |
|  | Thickness (μm) | 110 | 110 | 110 |
|  | E'(25)Mpa | 1320 | 550 | 56 |
|  | E'(100)MPa | 161 | 138 | 32 |
|  | $R_{E1}$ | 0.12 | 0.25 | 0.57 |
|  | Linear thermal expansion coefficient (ppm/K) | 178 | 188 | 220 |

TABLE 1-continued

| | 1-1 | 1-2 | 1-3 | 1-4 | 2-1 | 2-2 | 2-3 | 2-4 | 2-5 | 3-1 | 3-2 | 3-3 | 3-4 | 3-5 |
|---|---|---|---|---|---|---|---|---|---|---|---|---|---|---|
| Placement (stretched in two directions) | | | | ○ | | | | | ○ | | | | | ○ |
| Average of stretch ratios (%) in three directions | | | | 0.3 | | | | | 1.1 | | | | | 1.1 |
| Difference among stretch ratios (%) | | | | 0.5 | | | | | 1.4 | | | | | 2.1 |
| Placement (stretched in all directions) | ○ | ○ | × | | ○ | ○ | ○ | × | | ○ | ○ | ○ | × | |
| Stretch D (mm) | 1 | 3 | 5 | | 1 | 3 | 5 | 7 | | 1 | 3 | 5 | 7 | |
| Average of stretch ratios (%) in three directions | 0.0 | 0.4 | — | | 0.0 | 0.4 | 0.8 | — | | 0.4 | 0.8 | 1.2 | — | |
| Difference among stretch ratios (%) | 0.4 | 0.4 | — | | 0.4 | 0.2 | 0.1 | — | | 0.3 | 0.1 | 0.0 | — | |
| Chucking | × | ○ | — | × | × | ○ | ○ | — | × | ○ | ○ | ○ | — | × |

<2> Manufacture of Holding Tools (Nos. 1-1 to 3-5)

By the methods illustrated in FIGS. 2 to 4, a plain film 201 was stretched in such a manner that a region corresponding to 85% of an area of a holding film 20 covering an opening 251h having a diameter of 30 cm in a fixing jig 251 when a state in which the plain film 201 is placed on the fixing jig 251 without being stretched (i.e., a state in which the plain film 201 is not loosened and stretched in the opening 251h) is seen laterally is pushed down with a columnar-shaped push jig 252. The degree of stretch was 1 mm, 3 mm, 5 mm or 7 mm (a distance "D" in FIG. 2) as seen laterally as described above. In this state, as illustrated in FIG. 3, a flat plate ring-shaped frame body 10 was affixed onto a holding layer 22 of each plain film 201. (At a temperature of 25° C., the frame body 10 had an inner diameter of 250 mm, the holding film 20 subjected to an isolating step had an outer diameter of 270 mm, and a contact area between the frame body 10 and the holding film 20 was 82 cm$^2$). Thereafter, by the method illustrated in FIG. 4, an unnecessary portion 202 was cut along an outer periphery of the frame body 10 with a cutting blade. A holding tool 1 on which the holding film 20 is placed was thus obtained.

A state at the time of the affixation and a state after the affixation were evaluated on the following criteria. Table 1 shows results of the evaluation (see items of "Placement").

"○": Placement was favorable, and this placed state was maintained.

"×": Affixation failure occurred or placed state was not maintained for 30 minutes or more.

<3> Evaluation of Holding Tool

A surface of the base layer 21 of the holding film 20 in each of the holding tools (1-1, 1-2, 1-4, 2-1 to 2-3, 2-5, 3-1 to 3-3, 3-5) obtained as described above in <2> was chucked and fixed to a surface 61 of a vacuum chucking-type chuck table 60 the temperature of which is set at 160° C. A state of the holding film 20 chucked and fixed to the chuck table 60 was evaluated on the following criteria. Table 1 shows results of the evaluation (see items of "Chucking"). In Table 1, "—" indicates that no evaluation was made on an experimental example in which the result of evaluation as to <2> was "○": Holding film was favorably chucked and fixed to chuck table.

"□": Holding film was chucked and fixed to chuck table, but was slightly wrinkled.

"×": Holding film was corrugated, and was not chucked and fixed to chuck table.

[2] Advantageous Effects of Examples

It is apparent from the results obtained in Experimental Example 1-4 (a comparative product), Experimental Example 2-5 (a comparative product), and Experimental Example 3-5 (a comparative product) that in the holding tool on which the holding film is placed while being stretched in a few directions such as two directions, a stretch ratio difference in the placed state is 0.5 to 2.1% which is relatively larger. As a result, although the holding tool was obtained, heat wrinkles generated under a heated environment hindered normal chucking.

According to Experimental Examples 1-1 to 1-3 (comparative products), it was possible to obtain the holding tool on which the holding film is placed while being stretched in all directions to the frame body. In Experimental Example 1-3, however, it was impossible to maintain the stretched state. In Experimental Example 1-1, it was impossible to achieve normal chucking due to heat wrinkles generated under a heated environment. In Experimental Example 1-2, the base layer 21 of the holding tool satisfies a relation of 35≤E'(25)≤1500; however, a ratio $R_{E1}$ is 0.12 which deviates from a range of 0.2≤$R_{E1}$≤1. As to the base layer 21 in Experimental Example 1-2, each of the elastic modulus E' at normal temperature and the elastic modulus E' under a heated environment falls within a range suitable for component manufacture; however, a difference between the elastic moduli is large. As a result, it is considered that in a case of stretch D=3 mm, acceptable chucking is achieved, but has potentiality of a large stretch ratio difference of 0.4%, which may cause generation of heat wrinkles. In addition, the base layer 21 in Experimental Example 1-2 has the large elastic modulus E' at normal temperature, and therefore requires a larger force for bringing about a state of stretch D=3 mm as compared with those in Experimental Examples 2 and 3. According to Experimental Example 1-2, consequently, the holding tool was obtained in the state in which it is difficult to increase the stretch D more than 3 mm. For this reason, it is considered that it is possible to carry out the chucking step; however, it is difficult to carry out the pickup step using the same holding tool after the chucking step. That is, it is predicted that it is difficult to handle the holding tool since the stretch D that allows placement has a narrow permissible width.

In contrast to this, the base layer 21 of the holding tool in each of Experimental Examples 2 and 3 satisfies relations of 35≤E'(25)≤1500 and 0.2≤$R_{E1}$≤1. As a result, it was possible to maintain a placed state and to achieve normal chucking without generation of heat wrinkles under a heated environment, in a range of stretch D=3 to 5 mm in Experimental Example 2 and also in a considerably wide range of stretch D=1 to 5 mm in Experimental Example 3. In addition, a potential stretch ratio difference is 0.3% or less, which is small, in each of Experimental Examples 2 and 3. Particularly in Experimental Example 2-2, the potential stretch ratio difference is 0.2% which is considerably small. In Experimental Examples 2-3 and 3-2, the potential stretch ratio difference is 0.1% which is smaller. In Experimental Example 3-3, no stretch ratio difference is recognized.

It should be noted that the present invention is not limited to the foregoing specific examples, but various modifications can be made within the scope of the present invention depending on the purpose and use.

The present specification also embraces the following method for using a holding film, in addition to the foregoing component manufacturing method, holding film, and holding tool forming device.

[1] A method for using a holding film in a component manufacturing process of manufacturing any component selected from a semiconductor component and an electronic component, wherein the holding film includes: a base layer; and a holding layer disposed on a first surface side of the base layer, a ratio $R_{E1}$ (=E'(100)/E'(25)) of an elastic modulus E'(100) of the base layer at 100° C. to an elastic modulus E'(25) of the base layer at 25° C. is in a range of 0.2≤$R_{E1}$≤1, the elastic modulus E'(25) is in a range from 35 MPa or more to 1500 MPa or less, the component manufacturing process includes a holding tool forming step of forming a holding tool for holding a precursor to be processed into the component, and the holding tool forming step is a step of forming the holding tool by placing the holding film on a frame body having an opening such that the opening in the frame body is covered with the holding film while stretching the holding film in at least three different directions or in all directions to the frame body.

[2] The method for using the holding film as recited in [1], wherein the holding tool forming step includes:

a stretching step of pushing a plain film for the holding film from the base layer side to bring about a stretched state;

a fixing step of fixing the plain film to the frame body such that the stretched state is maintained; and an isolating step of isolating an unnecessary portion from the plain film to obtain the holding film.

[3] The method for using the holding film as recited in [1] or [2], wherein the holding tool forming step is a step of placing the holding film on the frame body such that stretch ratios measured in three different conformal radial directions with a center of the opening defined as a base point take an average value of 0.3% or more.

[4] The method for using the holding film as recited in [2] or [3], wherein the stretching step is a step of pushing the plain film from the base layer side with a push jig to stretch the plain film, and the push jig to be brought into contact with the plain film has a substantially circular contact outer edge.

[5] The method for using the holding film as recited in any of [2] to [4], the method comprising:

a holding step of holding the precursor in a stretched region of the plain film in the holding tool forming step or on the holding film of the obtained holding tool.

[6] The method for using the holding film as recited in [5], the method further comprising:

a dividing step of, after the holding step, dividing the precursor while holding the precursor on the holding film to obtain divided components.

[7] The method for using the holding film as recited in [5] or [6], the method further comprising:

a chucking step of, after the holding step, chucking the holding film on which the precursor is held or the divided components are held, to a surface of the chuck table that is heated, from the base layer side.

[8] The method for using the holding film as recited in [7], the method further comprising:

a pickup step of, in a case where the divided components are held on the holding film after the chucking step, pushing some of the divided components from the base layer side toward the holding layer side to further stretch the holding film, and picking up the divided components thus pushed while separating the divided components from the remaining divided components.

INDUSTRIAL APPLICABILITY

A component manufacturing method, a holding film, and a holding tool forming device according to the present invention are widely applicable in manufacturing a semiconductor component and in manufacturing an electronic component. In particular, a component manufacturing method comprising an evaluation step under a heated environment, a dividing step, and a pickup step is suitably used from the viewpoint of manufacturing a component with excellent productivity.

REFERENCE SIGNS LIST

1; holding tool
10; frame body, 10h; opening, 10a; first surface
111; inner frame, 112; outer frame
121; upper frame, 122; lower frame
20; holding film, 20'; holding film, 201; plain film, 202; unnecessary portion
21; base layer
22; holding layer
251; fixing jig, 251h; opening, 252; push jig, 252a; contact outer edge, 253; cutting blade
50; held component (precursor, component), 51; primary precursor, 52; secondary precursor (divided component)
60; chuck table, 61; surface (top surface)
70; holding tool forming device, 71; stretching mechanism, 72; fixing mechanism, 721; frame body jig, 73; isolating mechanism
80; probe card, 81; probe
91; stopper, 92; push-up member, 93; pickup tool
R10; holding tool forming step, R101; stretching step, R102; fixing step, R103; isolating step
R11; holding step
R12; chucking step
R13; evaluation step
R14; dividing step R15; separating step
R16; pickup step
P; center (graphical center of gravity)
X; wrinkle (heat wrinkle)

The invention claimed is:

1. A component manufacturing method for manufacturing any component selected from a semiconductor component and an electronic component, the component manufacturing method comprising:
   a holding tool forming step of forming a holding tool for holding a precursor to be processed into the component,
   a holding step of holding the precursor on a holding film of the obtained holding tool, and
   a chucking step of, after the holding step, chucking the holding film on which the precursor is held or divided components divided from the precursor are held, to a surface of a chuck table that is previously heated, from a base layer side,
   wherein
   the holding tool includes: a frame body having an opening; and the holding film placed on the frame body so as to cover the opening,
   the holding tool forming step is a step of placing the holding film on the frame body while stretching the holding film in at least three different directions or in all directions to the frame body such that stretch ratios measured in three different conformal radial directions with a center of the opening defined as a base point take an average value of 0.3% or more,
   the holding film includes: a base layer; and a holding layer disposed on a first surface side of the base layer,
   the base layer is a thermoplastic polyester-based elastomer, or a thermoplastic polyamide-based elastomer,
   a ratio $R_{E1}$ (=E'(100)/E'(25)) of an elastic modulus E'(100) of the base layer at 100° C. to an elastic modulus E'(25) of the base layer at 25° C. is in a range of $0.30 \leq R_{E1} \leq 1$, and
   the elastic modulus E'(25) is in a range from 35 MPa to 500 MPa.

2. The component manufacturing method according to claim 1, wherein
   the holding tool forming step includes:
   a stretching step of pushing a plain film for the holding film from the base layer side to bring about a stretched state;
   a fixing step of fixing the plain film to the frame body such that the stretched state is maintained; and
   an isolating step of isolating an unnecessary portion from the plain film to obtain the holding film.

3. The component manufacturing method according to claim 2, wherein
   the stretching step is a step of pushing the plain film from the base layer side with a push jig to stretch the plain film, and
   the push jig to be brought into contact with the plain film has a substantially circular contact outer edge.

4. The component manufacturing method according to claim 1, further comprising:
   a dividing step of, after the holding step, dividing the precursor while holding the precursor on the holding film to obtain divided components.

5. The component manufacturing method according to claim 1, further comprising:
   a pickup step of, in a case where the divided components are held on the holding film after the chucking step, pushing some of the divided components from the base layer side toward the holding layer side to further stretch the holding film, and picking up the divided components thus pushed while separating the divided components from the remaining divided components.

6. A holding film for use in the component manufacturing method for manufacturing any component selected from a semiconductor component and an electronic component,
   the component manufacturing method comprising:
   a holding tool forming step of forming a holding tool for holding a precursor to be processed into the component,
   a holding step of holding the precursor on a holding film of the obtained holding tool, and
   a chucking step of, after the holding step, chucking the holding film on which the precursor is held or divided components divided from the precursor are held, to a surface of a chuck table that is previously heated, from a base layer side,
   wherein
   the holding tool includes: a frame body having an opening; and the holding film placed on the frame body so as to cover the opening,
   the holding tool forming step is a step of placing the holding film on the frame body while stretching the holding film in at least three different directions or in all directions to the frame body such that stretch ratios measured in three different conformal radial directions with a center of the opening defined as a base point take an average value of 0.3% or more,
   the holding film comprising: a base layer; and a holding layer disposed on the first surface side of the base layer, wherein
   the base layer is a thermoplastic polyester-based elastomer, or a thermoplastic polyamide-based elastomer,
   a ratio $R_{E1}$ (=E'(100)/E'(25)) of an elastic modulus E'(100) of the base layer at 100° C. to an elastic modulus E'(25) of the base layer at 25° C. is in a range of $30 \leq R_{E1} \leq 1$, and
   the elastic modulus E'(25) is in a range from 35 MPa to 500 MPa.

7. The holding film according to claim 6, wherein
   the base layer has a linear thermal expansion coefficient of 100 ppm/K or more.

8. A component manufacturing method for manufacturing any component selected from a semiconductor component and an electronic component,
   the component manufacturing method comprising:
   a holding tool forming step of forming a holding tool for holding a precursor to be processed into the component,
   a chucking step of, after the holding step, chucking a holding film on which the precursor is held or divided components divided from the precursor are held, to a surface of a chuck table that is previously heated, from a base layer side,
   wherein
   the holding tool forming step includes:
   a stretching step of pushing a plain film for the holding film from the base layer side to bring about a stretched state;
   a fixing step of fixing the plain film to a frame body such that the stretched state is maintained;
   a holding step of holding the precursor in a stretched region of the plain film; and
   an isolating step of isolating an unnecessary portion from the plain film to obtain the holding film, the holding tool includes: the frame body having an opening; and the holding film placed on the frame body so as to cover the opening, the holding tool forming step is a step of placing the holding film on the frame body while stretching the holding film in at least three different directions or in all directions to the frame body such that stretch ratios measured in three different conformal radial directions with a center of the opening defined as a base point take an average value of 0.3% or more, the holding film includes: a base layer; and a holding layer disposed on a first surface side of the base layer, the base layer is a thermoplastic polyester-based elastomer, or a thermoplastic polyamide-based elastomer, a ratio $R_{E1}$ ($=E'(100)/E'(25)$) of an elastic modulus $E'(100)$ of the base layer at 100° C. to an elastic modulus $E'(25)$ of the base layer at 25° C. is in a range of $0.30 \leq R_{E1} \leq 1$, and the elastic modulus $E'(25)$ is in a range from 35 MPa to 500 MPa.

* * * * *